(12) United States Patent
Yu et al.

(10) Patent No.: US 8,488,399 B2
(45) Date of Patent: Jul. 16, 2013

(54) SEMICONDUCTOR DEVICES HAVING A THREE-DIMENSIONAL STACKED STRUCTURE AND METHODS OF DE-SKEWING DATA THEREIN

(75) Inventors: Hak-Soo Yu, Seongnam-si (KR); Sang-Bo Lee, Yongin-si (KR); Hong-Sun Hwang, Suwon-si (KR); Dong-Hyun Sohn, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 192 days.

(21) Appl. No.: 13/108,130

(22) Filed: May 16, 2011

(65) Prior Publication Data

US 2011/0286254 A1 Nov. 24, 2011

(30) Foreign Application Priority Data

May 20, 2010 (KR) ........................ 10-2010-0047645

(51) Int. Cl.
*G11C 7/00* (2006.01)
(52) U.S. Cl.
USPC ................................ 365/194; 365/51; 365/72
(58) Field of Classification Search
USPC ................................ 365/51, 72, 63, 194, 191
See application file for complete search history.

(56) References Cited

U.S. PATENT DOCUMENTS

| 4,509,148 | A | * | 4/1985 | Asano et al. | ............. 365/230.06 |
| 6,879,505 | B2 | | 4/2005 | Scheuerlein | |
| 7,489,570 | B2 | * | 2/2009 | Kim et al. | ..................... 365/198 |
| 7,852,706 | B2 | * | 12/2010 | Bae et al. | .................... 365/233.1 |
| 2009/0174032 | A1 | | 7/2009 | Maejima et al. | |

FOREIGN PATENT DOCUMENTS

| KR | 100827697 B1 | 4/2008 |
| KR | 1020080070098 A | 7/2008 |

* cited by examiner

*Primary Examiner* — Andrew Q Tran
(74) *Attorney, Agent, or Firm* — Myers Bigel Sibley & Sajovec

(57) ABSTRACT

A semiconductor memory device having a 3D stacked structure includes: a first semiconductor area with a stacked structure of a first layer having first data and a second layer having second data; a first line for delivering an access signal for accessing the first semiconductor area; and a second line for outputting the first and/or second data from the first semiconductor area, wherein access timings of accessing the first and second layers are controlled so that a first time delay from the delivery of the access signal to the first layer to the output of the first data is substantially identical to a second time delay from the delivery of the access signal to the second layer to the output of the second data, thereby compensating for skew according to an inter-layer timing delay and thus performing a normal operation. Accordingly, the advantage of high-integration according to a stacked structure can be maximized by satisfying data input/output within a predetermined standard.

13 Claims, 29 Drawing Sheets

(a)

(b)

(a)

(b)

SEMICONDUCTOR DEVICES HAVING A THREE-DIMENSIONAL STACKED STRUCTURE AND METHODS OF DE-SKEWING DATA THEREIN

CROSS-REFERENCE TO RELATED APPLICATIONS

This application claims the benefit of Korean Patent Application No. 10-2010-0047645, filed on May 20, 2010, in the Korean Intellectual Property Office, the disclosure of which is incorporated herein in its entirety by reference.

BACKGROUND

The inventive concept relates to methods of driving semiconductor devices and semiconductor devices having a three dimensional (3D) stacked structure.

As semiconductor devices, e.g., memory devices, have gradually become highly integrated, a regular two dimensional (2D) structure has almost reached the limits of high-integration. A project for implementing a semiconductor memory device having a 3D structure to overcome the limits of this 2D structure has become of increasing interest, and research into implementing such a semiconductor memory device is being actively conducted.

SUMMARY

The inventive concept provides a semiconductor device having a 3D structure to overcome the conventional problem.

The inventive concept also provides a semiconductor memory device having a 3D structure to minimize data skew and a driving method thereof.

The inventive concept also provides a data de-skewing method for reducing a data input/output time difference between layers that occurs due to their structure, in a semiconductor device having a 3D structure.

According to an aspect of the inventive concept, there is provided a semiconductor device including: a first semiconductor area with a stacked structure of a first layer having first data and a second layer having second data; a first line for delivering an access signal for accessing the first semiconductor area; and a second line for outputting at least one of the first and the second data from the first semiconductor area, wherein access timings of accessing the first and second layers are controlled so that a first time delay from the delivery of the access signal to the first layer to the output of the first data is substantially identical to a second time delay from the delivery of the access signal to the second layer to the output of the second data.

According to another aspect of the inventive concept, there is provided a semiconductor memory device including: a cell area with a stacked structure of a first layer having first data and a second layer having second data; a first line for delivering an access signal for accessing the cell area; and a second line for outputting data of the cell area, wherein access timings of accessing the first and second layers are controlled so that a first time delay from the delivery of the access signal to the first layer to output of the first data is substantially identical to a second time delay from the delivery of the access signal to the second layer to output of the second data.

According to another aspect of the inventive concept, there is provided a semiconductor memory device including a plurality of layers of a stacked structure, the semiconductor memory device including: a memory area including memory arrays disposed in at least two layers; a local wordline, which is disposed in correspondence with each of the layers and accesses each of the layers; a common wordline for providing a wordline voltage to the memory area; a bitline disposed to output data of the memory area; and a circuit area, which is disposed in any one of the plurality of layers, generates the wordline voltage, and interfaces the data with the outside, wherein the common wordline provides the wordline voltage in the order from a layer relatively far from the circuit area to a layer relatively near to the circuit area.

According to another aspect of the inventive concept, there is provided a method of de-skewing data in a semiconductor device having a three dimensional (3D) stacked structure, which includes a first semiconductor area disposed in a plurality of layers of a stacked structure, a first line for delivering an access signal for accessing the first semiconductor area, and a second line for inputting and outputting data of the first semiconductor area, the method including: detecting a time delay of inputting and outputting data through the second line in each of the plurality of layers; and controlling access timings of the plurality of layers using the first line to compensate for a data input/output time delay difference between the plurality of layers.

It is noted that aspects of the invention described with respect to one embodiment, may be incorporated in a different embodiment although not specifically described relative thereto. That is, all embodiments and/or features of any embodiment can be combined in any way and/or combination. These and other objects and/or aspects of the present invention are explained in detail in the specification set forth below.

BRIEF DESCRIPTION OF THE DRAWINGS

Exemplary embodiments of the inventive concept will be more clearly understood from the following detailed description taken in conjunction with the accompanying drawings in which.

DETAILED DESCRIPTION OF THE EMBODIMENTS

Figure 1:
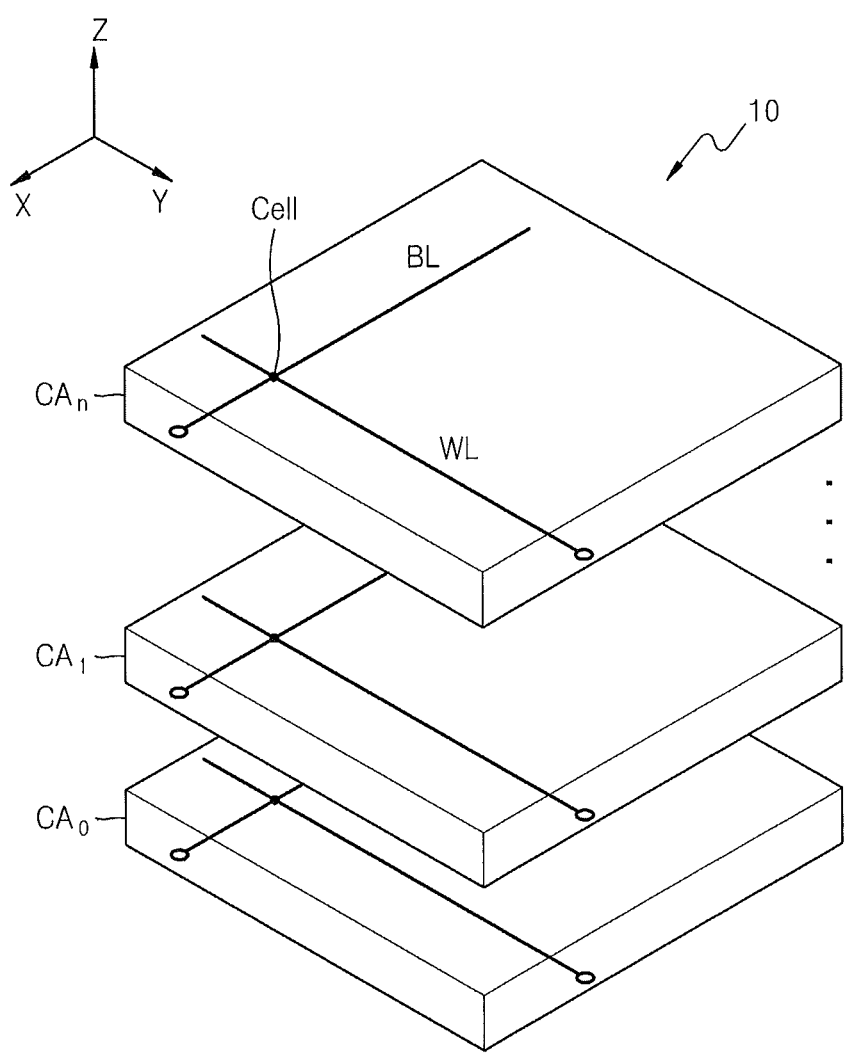
FIG. 1 is a schematic diagram of a cell array structure of a semiconductor memory device having a 3D stacked structure according to some embodiments of the present inventive concept.

The present inventive concept now will be described more fully hereinafter with reference to the accompanying drawings, in which embodiments thereof are shown. However, this inventive concept should not be construed as limited to the embodiments set forth herein. Rather, these embodiments are provided so that this disclosure will be thorough and complete, and will fully convey the scope of the inventive concept to those skilled in the art.

It will be understood that, although the terms first, second, etc. may be used herein to describe various elements, these elements should not be limited by these terms. These terms are only used to distinguish one element from another element. Thus, a first element discussed below could be termed a second element without departing from the scope of the present inventive concept. In addition, as used herein, the singular forms "a", "an" and "the" are intended to include the plural forms as well, unless the context clearly indicates otherwise. It also will be understood that, as used herein, the term "comprising" or "comprises" is open-ended, and includes one or more stated elements, steps and/or functions without precluding one or more unstated elements, steps and/or functions. The term "and/or" includes any and all combinations of one or more of the associated listed items.

It will also be understood that when an element is referred to as being "connected" to another element, it can be directly connected to the other element or intervening elements may be present. In contrast, when an element is referred to as being "directly connected" to another element, there are no intervening elements present. It will also be understood that the sizes and relative orientations of the illustrated elements are not shown to scale, and in some instances they have been exaggerated for purposes of explanation.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and this specification and will not be interpreted in an idealized or overly formal sense unless expressly so defined herein. The present inventive concept will now be described more fully hereinafter with reference to the accompanying drawings, in which some embodiments are shown. This inventive concept, however, may be embodied in many different forms and should not be construed as limited to the embodiments set forth herein. Rather, these embodiments are provided so that this disclosure will be thorough and complete, and will fully convey the scope of the invention to those skilled in the art.

It should be construed that forgoing general illustrations and following detailed descriptions are exemplified and an additional explanation of claimed inventive concept is provided.

Reference numerals are indicated in detail in some embodiments of the present inventive concept, and their examples are represented in reference drawings. Throughout the drawings, like reference numerals are used for referring to the same or similar elements in the description and drawings.

A memory device includes volatile memories, such as dynamic random access memories (DRAMs) and static random access memories (SRAMs), ideally non-refreshing nonvolatile memories, such as phase change random access memories (PRAMs), resistive random access memories (RRAMs) using substances such as complex metal oxides with variable resistance characteristics, and magnetic random access memories (MRAMs) using ferromagnetic substances. Recently, there is a tendency to apply a refresh operation to even nonvolatile memories.

FIG. 1 is a schematic diagram of a cell array structure of a semiconductor memory device 10 having a 3D stacked structure.

Referring to FIG. 1, the semiconductor memory device 10 includes a cell area having a plurality of cell layers CA0 to CAn stacked in a 3D structure.

In detail, any one cell layer (e.g., CA0) of the plurality of cell layers CA0 to CAn includes wordlines WL disposed lengthwise in a Y axis direction, bitlines BL disposed lengthwise in an X axis direction, which is perpendicular to the Y axis direction, and memory cells disposed at cross points of the wordlines WL and the bitlines BL.

Any one cell layer (e.g., CA0) of the plurality of cell layers CA0 to CAn has a 2D structure and includes a memory cell array structure of a typical semiconductor memory device. Here, the typical semiconductor memory device may include the volatile and/or nonvolatile memories described above.

The plurality of cell layers CA0 to CAn are stacked with a predetermined space therebetween in a Z axis direction perpendicular to both of the Y axis direction and the X axis direction.

Although the plurality of cell layers CA0 to CAn are stacked with a predetermined space therebetween or isolated through insulating materials disposed therebetween in FIG. 1, the present inventive concept is not limited thereto. That is, at least one layer CA0 to CAn may be stacked to be adjacent to each other so that the adjacent layers can share at least one of wordlines WL or bitlines BL.

Each of the memory cells of the plurality of cell layers CA0 to CAn has a unit cell structure of the memory device described above.

For example, a DRAM may be comprised of a single cell transistor and a single capacitor or may comprise a single capacitorless transistor, an RRAM may be comprised of a single variable resistance device, and a PRAM may be comprised of a single variable resistance device R and a diode device D.

Figure 2:
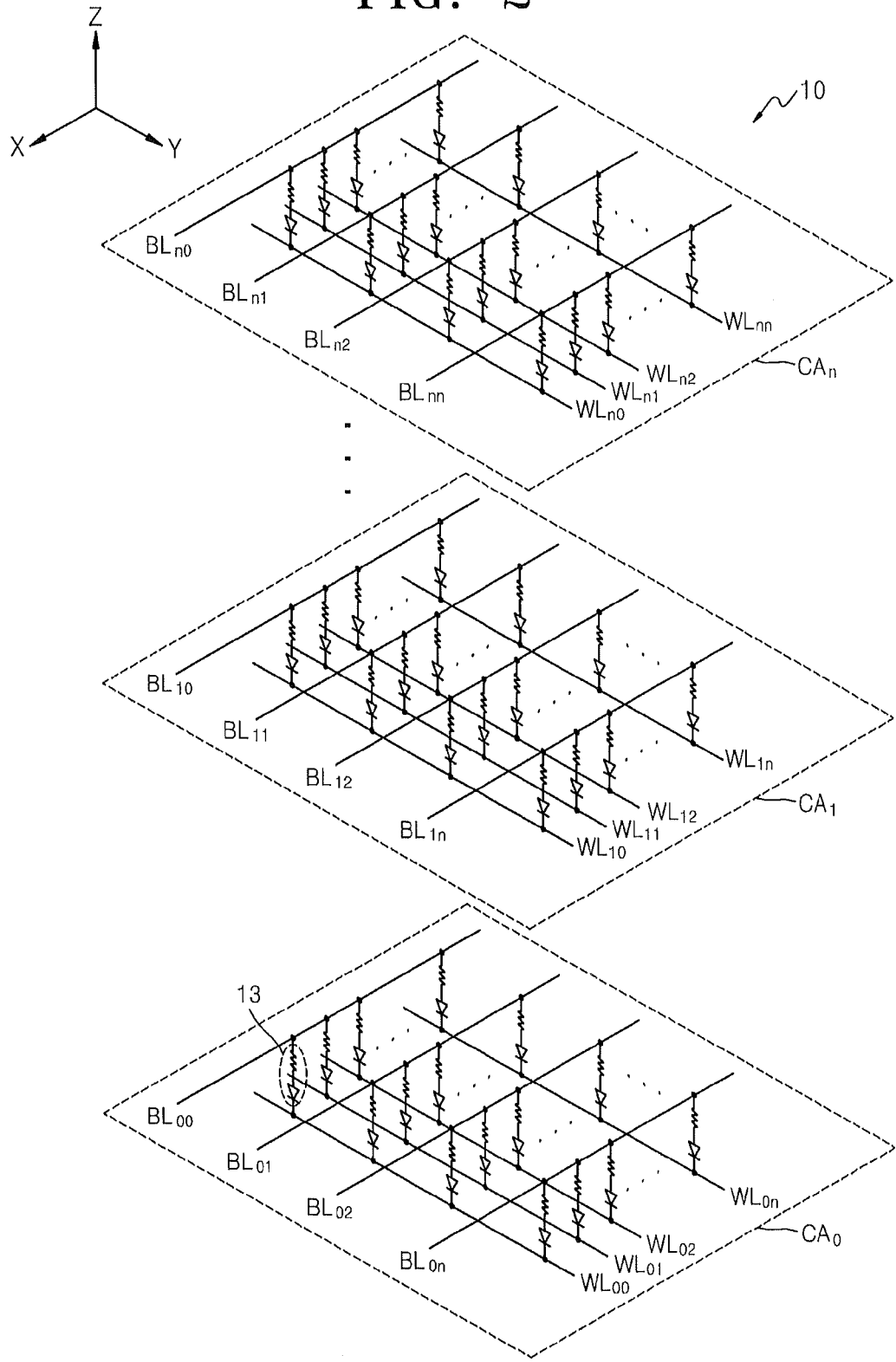
FIG. 2 is a schematic diagram of an example of the semiconductor memory device of FIG. 1 implemented with a phase change random access memory (PRAM)

FIG. 2 is a schematic diagram of an example of the semiconductor memory device of FIG. 1 implemented with a PRAM.

Even though the number of wordlines WL is generally not the same as the number of bitlines BL, for convenience of understanding FIG. 2 illustrates that the number of wordlines WL is the same as the number of bitlines BL.

In addition, although, as illustrated, the number of layers CA0 to CAn is identical to the number of wordlines WL or the number of bitlines BL in FIG. 2, the actual number of layers CA0 to CAn may be different from the number of wordlines WL and/or the number of bitlines BL. Various kinds of reference characters and reference numerals shown in FIG. 2 are only examples for convenience of description of exemplary embodiments of the present inventive concept, and exemplary embodiments of the present inventive concept are not limited thereto and various changes in form and details may be made therein.

Referring to FIG. 2, a first layer CA0 includes a plurality of (e.g., n+1) bitlines BL00 to BL0n disposed lengthwise in the X axis direction with a predetermined space therebetween and a plurality of (e.g., n+1) wordlines WL00 to WL0n disposed lengthwise in the Y axis direction with a predetermined space therebetween.

A memory cell 13 is disposed at each of the crossing points of the wordlines WL00 to WL0n and the bitlines BL00 to BL0n.

A second layer CA1 includes a plurality of (e.g., n+1) bitlines BL10 to BL1n disposed lengthwise in the X axis direction with a predetermined space therebetween and a plurality of (e.g., n+1) wordlines WL10 to WL1n disposed lengthwise in the Y axis direction with a predetermined space therebetween.

A memory cell is disposed at each of the crossing points of the bitlines BL10 to BL1n and the wordlines WL10 to WL1n.

As described above, the second layer CA1 has the same structure as the first layer CA0. In addition, third to (n+1)th layers CA2 to CAn, which are only distinguished by having different numbers of wordlines WL and bitlines BL, also have the same structure as the first layer CA0 and the second layer CA1.

Diodes of PRAM memory cells of the first to (n+1)th layers CA0 to CAn may include a material selected from among amorphous silicon, SiGe, and polycrystalline silicon, among others.

For example, diodes in the first layer CA0 may include polycrystalline silicon, and the other layers CA1 to CAn may include amorphous silicon or SiGe.

Figure 3:
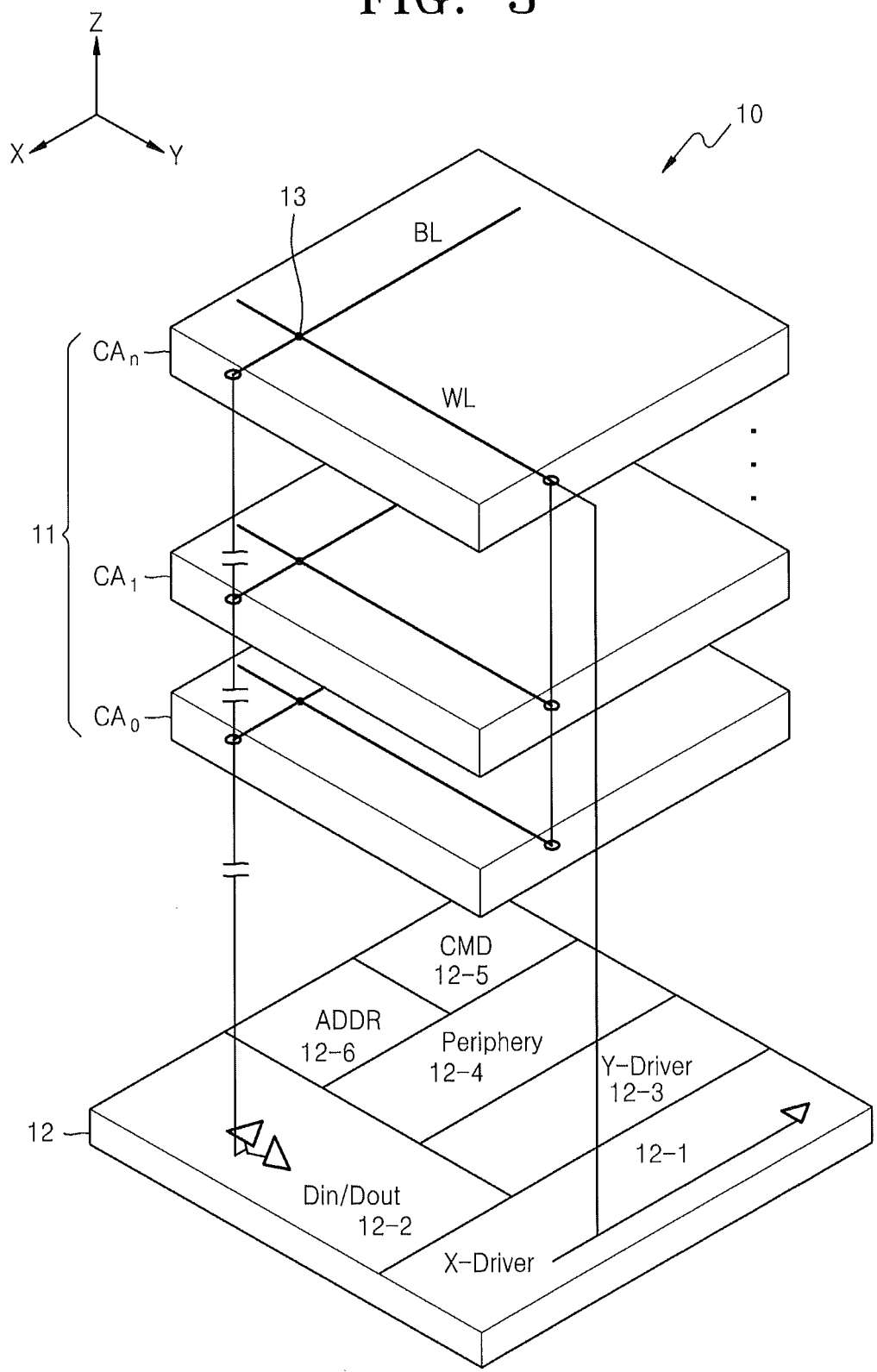
FIG. 3 is a block diagram of a semiconductor memory device having a 3D stacked structure according to some embodiments of the present inventive concept.

FIG. 3 is a block diagram of a semiconductor device 10 having a 3D stacked structure according to some embodiments of the present inventive concept.

The de-skew concept of the present inventive concept is not limited to an operation of a semiconductor memory device and is applicable to a 3D semiconductor device in which skew occurs in a data input/output timing between layers, which is due to the physical stacked structure. Here, a memory device is described as an example for convenience of description.

Referring to FIG. 3, the semiconductor device 10 having a 3D structure includes a plurality of layers CA0 to CAn of a stacked structure. For example, the semiconductor device 10 of FIG. 3 may include a first semiconductor area 11 in which the first to (n+1) layers CA0 to CAn are stacked and a second semiconductor area 12 including an interface circuit for interfacing with the outside.

The second semiconductor area 12 may be disposed in a different layer from the first semiconductor area 11. However, the second semiconductor area 12 may be disposed in any one of the layers CA0 to CAn of the first semiconductor area 11.

The semiconductor device 10 includes a first line WL for accessing the first semiconductor area 11 and a second line BL for delivering information to input/output the information to/from the first semiconductor area 11.

Although a single first line WL and a single second line BL are shown for each layer in FIG. 3, a plurality of first lines and second lines as shown in FIG. 2 may be disposed in the semiconductor device 10 of FIG. 3.

The first to (n+1) layers CA0 to CAn provide or receive information to and/or from the outside through a control logic circuit and/or an interface in the same chip or package. Meanwhile, in a case of a semiconductor memory, the information inputting and outputting described above may be achieved through data read and write operations.

When the information inputting and outputting is achieved, a difference in physical length between the first line WL and/or the second line BL of the first to (n+1) layers CA0 to CAn is inevitably generated.

For example, if an access signal for accessing information for each of the layers CA0 to CAn is provided by a driver (e.g., an X-driver) of the second semiconductor area 12, when the access signal is delivered to each of the layers CA0 to CAn, a difference in the physical length between access signal delivery paths occurs.

In addition, if information of each of the layers CA0 to CAn is delivered to a buffer (e.g., an input/output buffer Din/Dout) of the second semiconductor area 12, a physical length difference occurs in an information delivery path through the secondary line BL.

Due to these differences in physical lengths, when the plurality of layers CA0 to CAn are accessed, a different time delay occurs in an actual data input/output for each layer. This time delay difference in a data input/output between layers is referred to as skew.

Meanwhile, when a switching device or a delay device is formed in the layers CA0 to CAn, the skew problem described above may be solved by using the switching device or the delay device. An example of the switching device or the delay device includes a transistor.

However, in a structure of a cross-point 3D memory, such as a 3D RRAM or PRAM, having a monolithic structure, each of the layers CA0 to CAn is comprised of a resistive device and a diode in each cell, and devices such as a transistor and a switch are not formed.

This can be applied in the same way to a structure in which a cell area of a general DRAM, SRAM, or flash memory is stacked. For example, a resistive delay component may be differently added to each of the layers CA0 to CAn to reduce skew between layers.

However, in the above-described structure, a method for compensating for skew without adding a unit device, such as a switching device or a delay device, to the layers CA0 to CAn must be considered.

To do this, a physical distance of an access signal through the first line WL and/or an information delivery path through the second line BL can be adjusted to compensate for an amount of skew due to a structural distance of the first line WL for accessing and/or the second line BL for inputting/ outputting, i.e., an amount of skew according to inter-layer physical arrangements.

The first line WL may include a common wordline or a main wordline in a method having a hierarchical structure and may further include a signal line or a control line for controlling such a wordline.

The second line BL may include a common bitline or an input/output (I/O) line (global I/O or local I/O).

Meanwhile, FIG. 3 shows an example in which the second semiconductor area 12, e.g., an interface area, is disposed at the bottom of the stacked layers CA0 to CAn.

The second semiconductor area 12 may include an address buffer 12_6 for receiving and buffering an address from the outside, a command buffer 12_5 for receiving, buffering, and decoding a command from the outside, a data I/O unit 12_2 for inputting and outputting data to and from the first semiconductor area 11 through the second line BL, an X-driver 12_1 for controlling the first line WL, a Y-driver 12_3 for controlling an input/output of the second line BL, and a periphery circuit 12_4 including a voltage generator for generating a necessary source voltage and a logic circuit for controlling a general operation.

The second semiconductor area 12 may be disposed in the lowest layer as shown in FIG. 3, between layers, or in the uppermost layer. Although the second semiconductor area 12 is included in the semiconductor device 10 in FIG. 3, the second semiconductor area 12 can be implemented as a chip or package separate from the semiconductor device 10.

When the first line WL is disposed in the vertically same position of the layers CA0 to CAn, the first line WL may or may not be shared by the layers CA0 to CAn, and when the second line BL is disposed in the vertically same position of the layers CA0 to CAn, the second line BL may or may not be shared by the layers CA0 to CAn. For example, when the first line WL is defined as a path for delivering an access signal from the X-driver 12_1 of the second semiconductor area 12 to each layer of the first semiconductor area 11, the layers CA0 to CAn can share the first line WL (in detail, share a portion of the primary line WL). This will be dealt with in detail by way of the embodiments below.

The above-described method for adjusting a physical distance may, in other words, include sequential access from a layer in an opposite direction of (and a far physical distance from) the second semiconductor area 12 during access to the first line WL and/or the second line BL, and this means that actual access is achieved in a direction opposite to a direction where the access physically arrives.

Besides the physical skew compensation method described above, skew may be compensated for in the second semiconductor area 12 or the outside. This can be achieved through a Clock Data Recovery (CDR) method, a per-pin skew compensation method, or a combination thereof. This may be achieved through the methods disclosed in U.S. Pat. No. 7,542,362 and U.S. Patent Publication No. 2008/0130811 contained herein in their entireties by reference.

Figure 4:
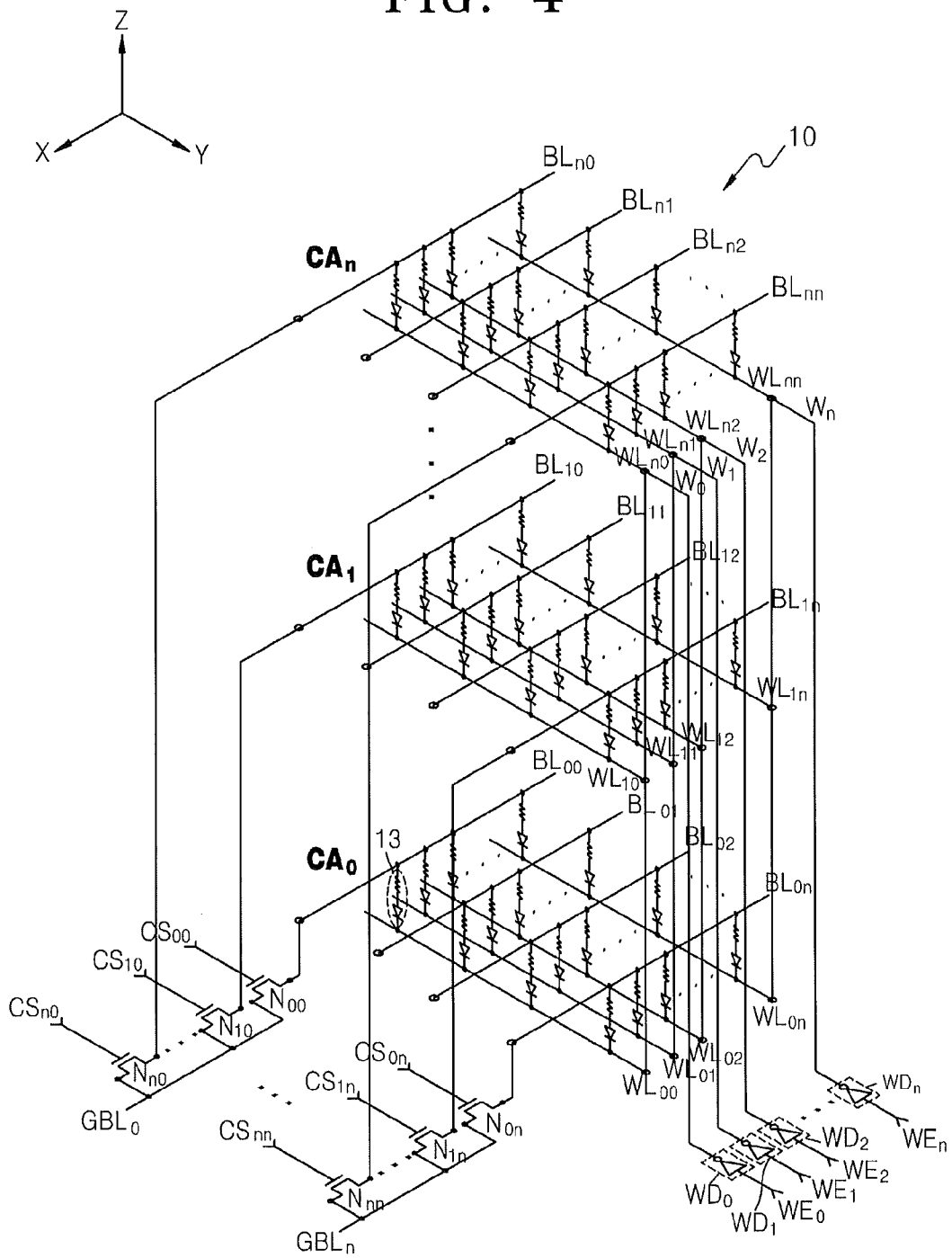
FIG. 4 is a detailed circuit diagram of the semiconductor memory device of FIG. 3.

FIG. 4 is a detailed circuit diagram of the semiconductor device of FIG. 3. FIG. 4 shows a semiconductor memory device including a memory cell as the semiconductor device.

A connection structure of primary lines WL00 to WLnn will now be described with reference to FIG. 4. Primary lines (e.g., WL00, WL10, . . . , WLn0) respectively selected in the layers (cell layers) CA0 to CAn are commonly connected to each other.

For example, first lines (e.g., WL00, WL10, . . . , WLn0) disposed in the same position are commonly connected to each other. The first lines (e.g., WL00, WL10, . . . , WLn0) disposed in the same position may mean first lines (e.g., WL00, WL10, . . . , WLn0) using the same X-address in the layers CA0 to CAn.

Thus, a plurality of first lines (e.g., the first lines WL00, WL10, . . . , WLn0) corresponding to one first line per layer can be accessed (e.g., enabled) at the same time with a single X-address. Accordingly, the number of X-addresses applied to select a specific memory cell is identical to the number of first lines WL00, WL10, . . . , WLn0 in a single layer (e.g., CA0), that is, as in a regular cell array structure.

The first lines (e.g., WL00, WL10, . . . , WLn0), which are commonly connected for the layers CA0 to Can, are controlled by a single first line driver (e.g., WD0). That is, a first line driver generates an access signal in response to a single first line enable signal (e.g., WE0), and the access signal can enable the commonly connected first lines (e.g., WL00, WL10, . . . , WLn0) at the same time.

As shown in FIG. 4, when each of the layers CA0 to CAn includes a memory cell, the first lines WL00 to WLnn are wordlines, and the access signal corresponds to a voltage level signal for allowing access to the wordlines.

A structure in which first lines of the layers CA0 to CAn are commonly connected can be understood as a common signal delivery path existing to deliver an access signal to the first lines of the layers CA0 to CAn.

For example, an access operation can be performed by delivering an access signal provided by a first line driver (e.g., WD0) in a predetermined direction (e.g., Z axis direction) and then delivering the access signal, which has been provided in the predetermined direction, in another direction (e.g., −Z axis direction) in each of the layers CA0 to CAn. In this case, the delivery path of the access signal in the Z axis direction (and −Z axis direction) can be shared in the layers CA0 to CAn. Each first line may be disposed in the common delivery path of the access signal or may include a delivery path in each layer, which is separated and disposed in each layer.

When each first line is defined as a delivery path separated and disposed in each layer, a third line may be further included in the semiconductor memory device 10 as a path (path in the Z axis direction and the −Z axis direction) for commonly delivering the access signal.

A connection structure of second lines BL00 to BLnn will now be described.

Each of the second lines BL00 to BLnn disposed in the layers CA0 to CAn is independently operated. For example, when a Y-address is applied to select a specific memory cell, the number of Y-addresses is identical to the number of second lines BL00 to BLnn.

The second lines BL00 to BLnn are connected to global second lines GBL0 to GBLn through selection transistors N00 to Nnn. The number of global second lines GBL0 to GBLn may be identical to the number of second lines (e.g., BL00, BL01, . . . , BL0n) in a single layer (e.g., CA0). Second lines (e.g., BL00, BL10, . . . , BLn0) disposed in the same position in each of the layers CA0 to Can, among the second lines BL00 to BLnn, are commonly connected to one (e.g., GBL0) of the global second lines GBL0 to GBLn through corresponding selection transistors (e.g., N00 to Nn0).

Second lines (e.g., BL00, BL10, . . . , BLn0) disposed in the same position in each of the layers CA0 to CAn may mean second lines (e.g., BL00, BL10, . . . , BLn0) using the same Y-address in each of the layers CA0 to CAn. In this case, the number of second lines of each of the layers CA0 to CAn enabled by a single Y-address is one.

Figure 5:
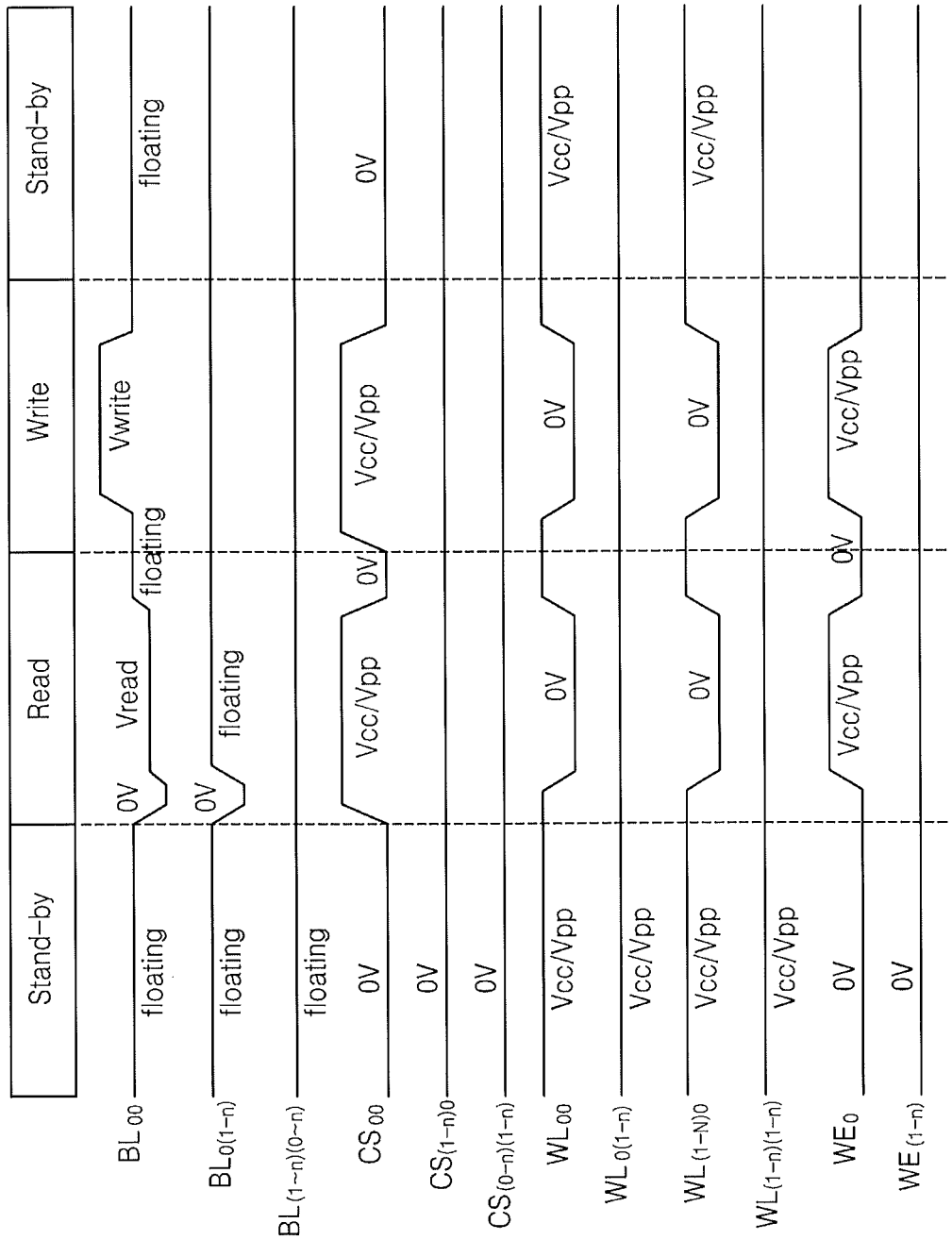
FIG. 5 is an operational timing diagram for describing an active operation of a semiconductor memory device having the structure of FIG. 4.

FIG. 5 is an operational timing diagram for describing an active operation (read or write operation) of a semiconductor memory device having the structure of FIG. 4. An operation of a semiconductor memory device according to some embodiments of the present inventive concept will now be described with reference to FIGS. 4 and 5.

FIG. 5 shows a case of reading or writing data from or to a memory cell 13 disposed at a cross point of a $1^{st}$ second line BL00 and a $1^{st}$ first line WL00 of the first layer CA0 shown in FIG. 4.

Referring to FIG. 5, in a stand-by state, all of the second lines BL00 to BLnn maintain a floating state and all of the first lines WL00 to WLnn maintain a state where a source voltage VCC/VDD or a voltage VPP of a predetermined level higher than the source voltage VCC/VDD is applied.

When a read operation for reading data from the memory cell 13 starts, the $1^{st}$ first line WL00 and the $1^{st}$ second line BL00 connected to the memory cell 13 are enabled to select the memory cell 13.

That is, a first line enable signal WE0 for selecting the $1^{st}$ first line WL00 of the first layer CA0 is applied to a $1^{st}$ first line driver WD0 at the source voltage VCC or at a level VPP that is higher than the source voltage VCC. The $1^{st}$ first line driver WD0 generates an access signal for accessing each of the layers CA0 to CAn.

While normally, the access signal is first delivered to the $1^{st}$ first line WL00 of the first layer CA0 physically nearest the $1^{st}$ first line driver WD0 and then sequentially delivered to layers in the top direction (Z axis direction), skew occurring due to a data input/output delay difference between layers according to a physical distance is compensated for in the present inventive concept.

To do this, the access signal is first delivered to a layer of the first semiconductor area 11, which has the farthest physical distance from the second semiconductor area 12, which is an interface area, (it is assumed that the second semiconductor area 12 is located in the lowest layer), to first enable a first line WLn0 of the uppermost layer CAn.

For example, when first lines WL00, WL10, . . . , WLn0 of the layers CA0 to CAn, which have the same X-address, receive the access signal through a common path, third lines W0 to Wn may be disposed as the common delivery path of the access signal and may include lines for delivering the access signal in a direction (Z axis direction) from the first layer CA0 to the (n+1)th layer CAn and lines for delivering the access signal in a direction (−Z axis direction) from the (n+1)th layer CAn to the first layer CA0. The access signal is sequentially provided to the layers CA0 to CAn through the lines for delivering the access signal in the negative Z axis direction.

When it is defined that the first lines WL00, WL10, . . . , WLn0 include the third lines W0 to Wn, the third lines W0 to Wn may be defined as extended first lines. In addition, since extended first lines for delivering the access signal in the positive Z axis direction are not directly connected to the layers CA0 to CAn, the first lines extended in the positive Z axis direction may be dummy lines.

First line drivers WD0 to WDn may be formed with an inverter. And, for example, when first line enable signal WE0 is applied to the first line driver WD0, the $1^{st}$ first line WL00 of the first layer CA0 and first lines WL10 to WLn0 commonly connected to the $1^{st}$ first line WL00 of the first layer CA0 are enabled to a ground level (0V). Here, the first line enable signals WE0 to WEn are generated when an X-address is applied.

In addition, a $1^{st}$ global second line GBL0 is selected to select the $1^{st}$ second line BL00 of the first layer CA0, thereby enabling a Y-selection signal CS00 to the source voltage level VCC or the level VPP that is higher than the source voltage level VCC. The Y-selection signal CS00 turns on a selection transistor N00 connected to the $1^{st}$ second line BL00 of the first layer CA0 to electrically connect the $1^{st}$ second line BL00 of the first layer CA0 to the $1^{st}$ global second line GBL0. Accordingly, a read voltage Vread applied through the $1^{st}$ global second line GBL0 is delivered to the $1^{st}$ second line BL00 of the first layer CA0. At this time, the other Y-selection signals CS(1 to n)0 and CS(0 to n)(1 to n) maintain a disable state at the ground level.

The second lines BL0(1 to n) and BL(1 to n)(0 to n), excluding the $1^{st}$ second line BL00 of the first layer CA0, maintain the floating state. For the $1^{st}$ second line BL00 of the first layer CA0 or all of the second lines BL0(0 to n) of the first layer CA0, when a read operation starts, i.e., just before the read voltage Vread is applied, a discharge operation of discharging the $1^{st}$ second line BL00 of the first layer CA0 or all of the second lines BL0(0 to n) of the first layer CA0 to the ground voltage (0V) may be performed. This discharging of the second line is done so that a floating voltage of a second line does not affect the read operation since a state of the second line cannot be correctly defined when the second line is in the floating state.

In addition, the reason why the second lines BL00 to BLnn are maintained in the floating state in the stand-by state or a non-selection state is to prevent or minimize a leakage current through the second lines BL00 to BLnn.

Thereafter, data is read by sensing a level state of the $1^{st}$ second line BL00 from the memory cell 13 of the first layer CA0.

In a write operation, since the same operation as the above-described read operation is performed, except for applying a write voltage Vwrite to the $1^{st}$ second line BL00 of the first layer CA0, a detailed description thereof will be omitted here. However, in the write operation, a discharge operation for the second line(s) may not be performed.

Figure 6:
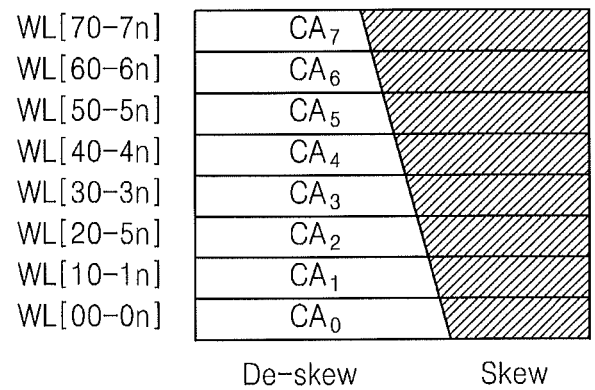
FIG. 6 is a schematic diagram for describing a de-skewing operation that occurs in the structure of FIG. 4.
Figure 6:
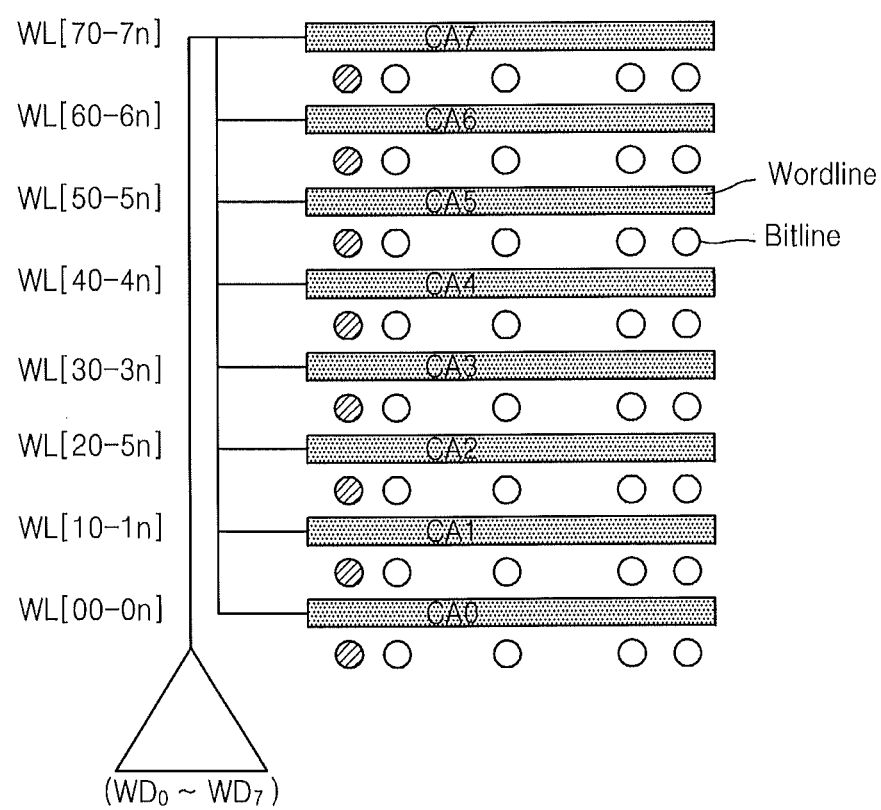

FIG. 6 is a schematic diagram for describing a de-skewing operation that occurs in the structure of FIG. 4. The diagram of FIG. 6 shows an example in which 8 layers are stacked.

Referring to FIG. 6 (a), it can be determined that inter-layer skew is compensated for due to a sequential inverse proportion of skew and de-skew.

When a second semiconductor area, e.g., an interface area (not shown), is located below a first layer CA0, an eighth layer CA7 located at the top has the longest physical length of second lines BL70 to 7n for delivering data in terms of inputting/outputting the data. Thus, a time delay when the data of the eighth layer CA7 is delivered to the interface area is greater than the other layers. In FIG. 6 (a), a right section represented with slashed lines indicates a delay from data access to data input/output.

In a general case, since a layer near the interface area has a small time delay, a time delay difference occurs in proportion to a physical distance from the eighth layer CA7 to the first layer CA0, and the time delay difference is referred to as skew.

To compensate for the above-described skew, an access operation is sequentially performed from the eighth layer CA7, i.e., from a layer having a large time delay. That is, by controlling a layer having a large time delay to have a short time interval from a driving time of an access signal to an access time of the layer, skew is compensated for, thereby balancing most skew. A left section represented with white indicates a time interval until an access signal is delivered to each of the layers CA0 to CA7 after being driven.

In terms of a time delay from when an access signal is driven to when data is output from each layer (or when the data is delivered to an output driver (not shown) in the interface area), the compensation of skew means that time delays from driving of an access signal to an output of data for respective layers are substantially identical to each other. That is, each of the time delays from driving an access signal to outputting data can be defined as a sum of a delay from when the access signal is driven to when the access signal is delivered to a corresponding layer and a delay until the data is delivered to the interface area. By controlling the inter-layer time delays to be substantially identical to each other, data from the plurality of layers CA0 to CA7 can be substantially delivered to the interface area at the same time.

FIG. 6(b) shows an example for describing de-skewing with first lines WL00 to WL7n as wordlines and second lines BL00 to BL7n as bitlines.

When skew occurs due to a long physical distance from wordline drivers WD0 to WD7, wordline access is performed for enabling wordlines from the eighth layer CA7 having the largest time delay of a data input/output due to the longest physical distance. This can be designed by using extended wordlines (and can be referred to as main wordlines or control lines).

Figure 7A:
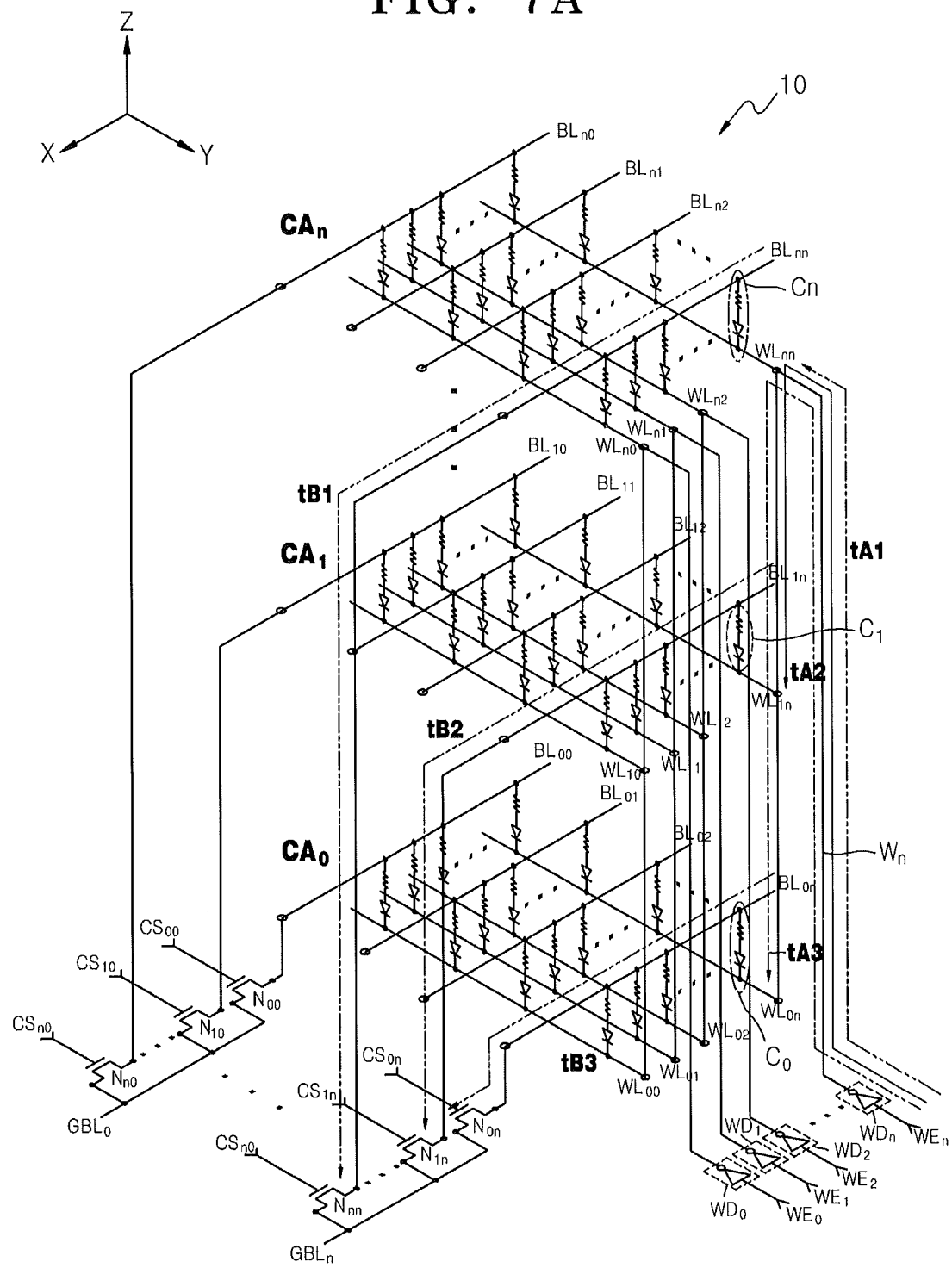
FIGS. 7A and 7B are respectively a detailed circuit diagram and a timing diagram for describing physical skew compensation that is performed in the 3D semiconductor memory device shown in FIG. 4.
Figure 7B:
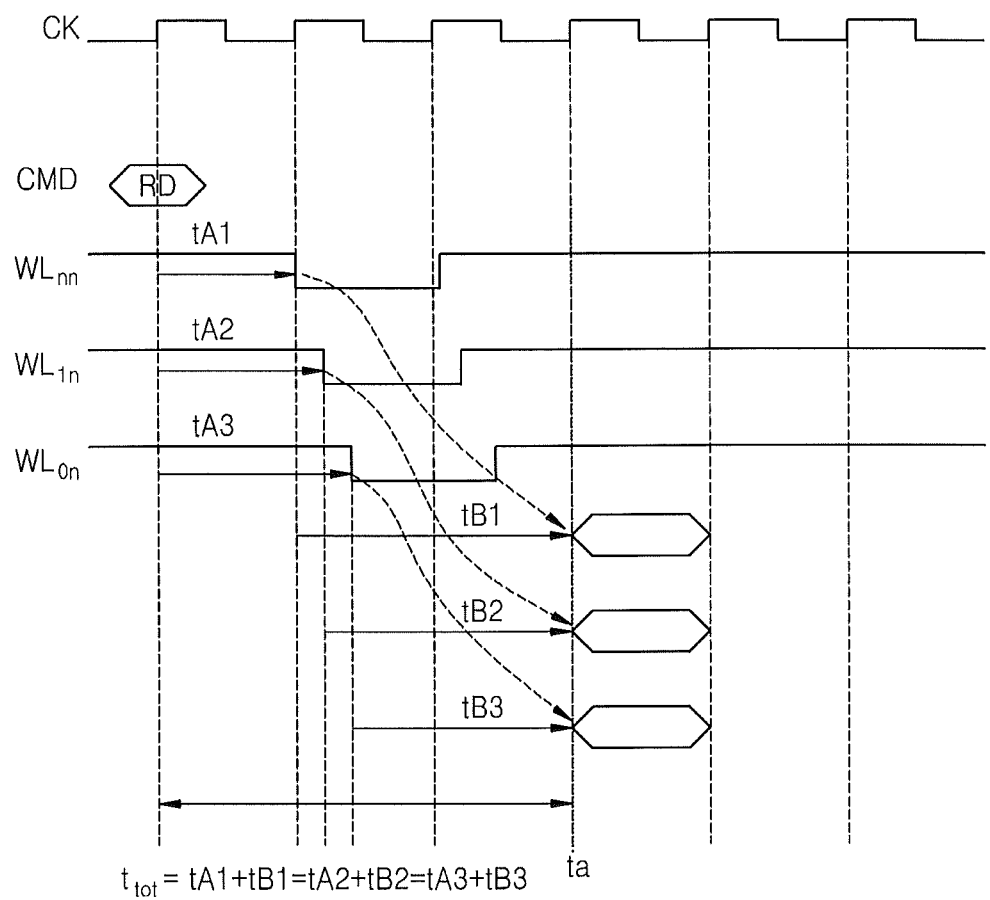

FIGS. 7A and 7B are respectively a detailed circuit diagram and a timing diagram for describing physical skew compensation that is performed in the 3D semiconductor memory device shown in FIG. 4.

Since a structure of FIG. 7A is the same as the structure of FIG. 4, a detailed description of the configuration and operation thereof will be omitted here.

Using the circuit of FIG. 7A, access timings and data read timings of memory cells controlled by an (n+1)th first line driver WDn may be compared with each other. For convenience of description, access timings and data read timings of only 3 memory cells C0, C1, and Cn are compared with each other. The memory cells C0, C1, and Cn are accessed through respective primary lines WL0n, WL1n, and WLnn sharing an extended primary line Wn.

FIG. 7B is a timing diagram for describing a data read timing when data is read in FIG. 7A.

Referring to FIGS. 7A and 7B, when a read command RD is input by being synchronized with a rising edge of an external clock CK, an (n+1)th first line enable signal WEn is input to an (n+1)th first line driver WDn through an operation (not shown) of decoding a corresponding X-address (low address).

The (n+1)th first line driver WDn applies a 'low enable' signal as an access signal to an (n+1)th extended first line Wn. At this time, an (n+1)th wordline WLnn of an (n+1)th layer CAn is enabled according to a physical connection relationship of the (n+1)th extended first line Wn. A delay from a driving time of the access signal to activation of the (n+1)th wordline WLnn is 'tA1'.

Thereafter, an (n+1)th wordline WL1n of a second layer CA1 is enabled, and a delay for this access is 'tA2'. Thereafter, an (n+1)th wordline WL0n of a first layer CA0 is enabled, and a delay for this access is 'tA3'.

According to a relationship among 'tA1', 'tA2', and 'tA3', it can be determined that 'tA3' is the largest as shown in FIG. 7B.

Meanwhile, second lines BL0n, BL1n, and BLnn for outputting data from the respective cells C0, C1, and Cn from which data is read are separated for the respective layers, and a relationship among time delays 'tB1', 'tB2', and 'tB3' of data input/output from the respective cells C0, C1, and Cn is inversely proportional to the relationship among 'tA1', 'tA2', and 'tA3'. That is, 'tB1' is the largest, and 'tB3' is the smallest.

Thus an affect due to skew is reduced by adjusting delay times so that delay times of the respective layers CA0 to CAn during access in terms of de-skew and delay times of the respective layers CA0 to CAn during data input/output in terms of skew are cleared therebetween.

As shown in FIG. 7B, 'ta' denotes a time when data delivered (input/output) through secondary lines are actually sensed and shows that data can be simultaneously sensed from a plurality of layers since there is little inter-layer skew. The data according to the sensing operation can be provided to the outside as output data. Accordingly, it can be determined that data is output without substantial skew from a read command generation time to a data output time for the layers CA0 to CAn.

Figure 8:
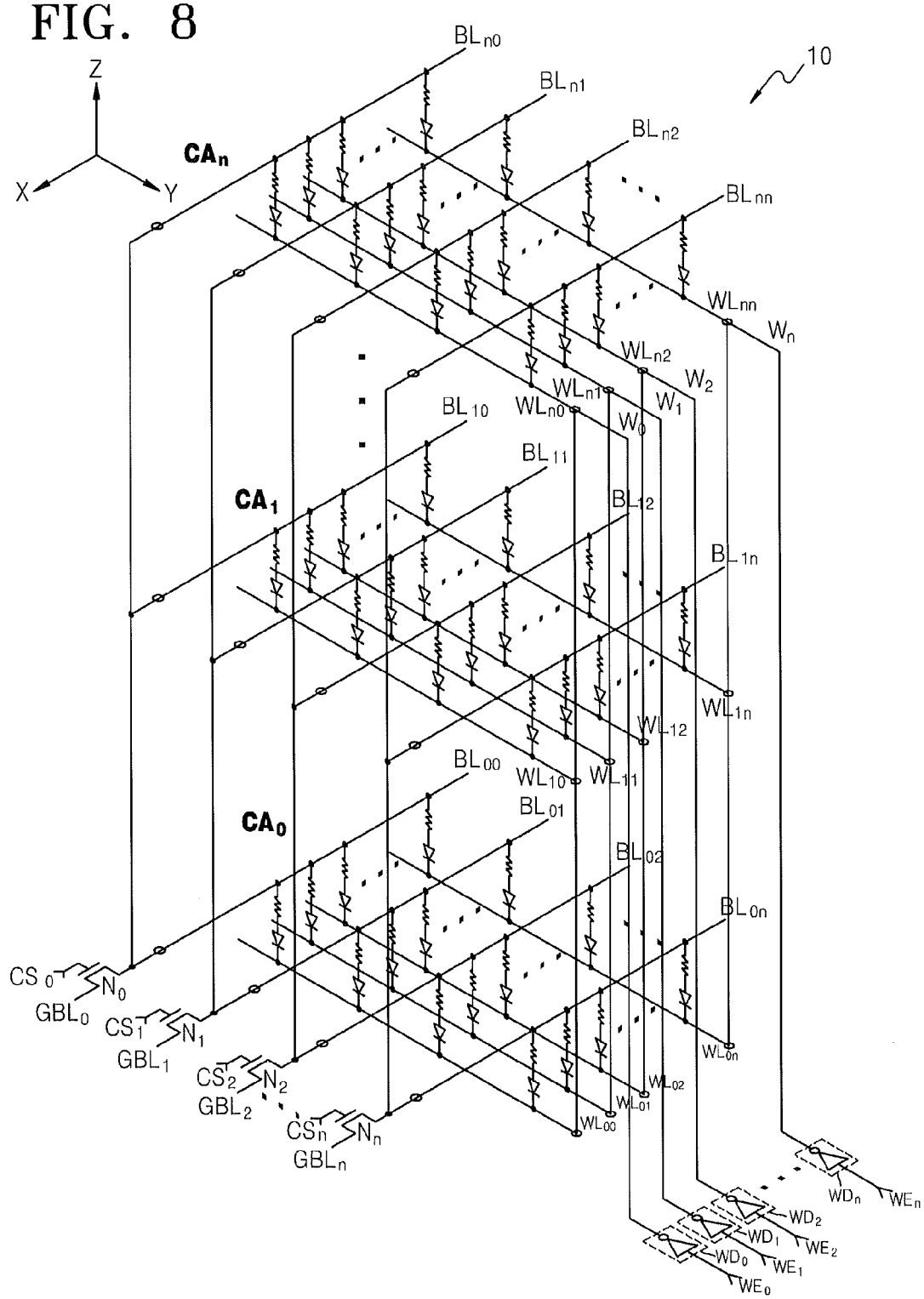
FIG. 8 is a detailed circuit diagram of a semiconductor memory device having a 3D stacked structure according to some embodiments of the present inventive concept.

FIG. 8 is a detailed circuit diagram of a semiconductor memory device having a 3D stacked structure according to another exemplary embodiment of the present inventive concept.

Referring to FIG. 8, second lines (e.g., BL00, BL10, ..., BLn0) selected from respective layers CA0 to CAn are commonly connected to each other.

For example, second lines (e.g., BL00, BL10, ..., BLn0) disposed in the same position are commonly connected to each other. Here, the second lines (e.g., BL00, BL10, ..., BLn0) disposed in the same position may mean second lines (e.g., BL00, BL10, ..., BLn0) using the same Y-address in the respective layers CA0 to CAn.

Accordingly, a plurality of second lines selected for the layers CA0 to CAn, that is, one per layer, can be enabled at the same time with a single Y-address, and the number of Y-addresses applied to select a specific layer is identical to the number of second lines (e.g., BL00 to BL0n) in a single layer (e.g., CA0) having the same structure as a regular layer structure.

In addition, second lines (e.g., BL00, BL10, ..., BLn0) commonly connected for the respective layers CA0 to CAn are controlled by a single selection transistor (e.g., N0). Due to this, commonly connected second lines (e.g., BL00, ..., BL10, BLn0) are enabled at the same time by a single Y-selection address (e.g., CS0).

The second lines BL00 to BLnn are connected to the global second lines GBL0 to GBLn through the Y-selection transistors N0 to Nn, respectively. The number of global second lines GBL0 to GBLn may be identical to the number of second lines (e.g., BL00 to BL0n) in a single layer (e.g., CA0).

Second lines (e.g., BL00, BL10, ..., BLn0) disposed in the same position of the layers CA0 to CAn among the second lines BL00 to BLnn are commonly connected to one (e.g., GBL0) of the global second lines GBL0 to GBLn through a single selection transistor (e.g., N0).

Since structures of the first lines WL00 to WLnn and the extended first lines W0 to Wn are substantially the same as the structures of FIGS. 4 and 7A, a detailed description thereof will be omitted here.

First lines (e.g., WL0n to WLnn) of the layers CA0 to CAn, which have the same X-address, are controlled through an extended first line (e.g., Wn), and a data input/output time delay between the layers CA0 to Can, which occurs due to the physical structure of input/output lines (second lines), can be compensated for by using the extended first line (e.g., Wn).

In the above-described configuration, since the first lines WL00 to WLnn are commonly connected between layers having the same X-address and the second lines BL00 to BLnn are commonly connected between layers having the same Y-address, although not shown, when data is input/output, memory cells 13 of layers for which the second lines BL00 to BLnn are commonly connected cannot be independently controlled by only using the selection transistors N0 to Nn, so an additional switching control is necessary. This switching control can be performed through the interface area disposed inside or outside the memory device 10 or through a separate chip.

In some embodiments, a functional block for performing the switching control function may be added between the second lines BL00 to BLnn and the selection transistors N0 to Nn in FIG. 8. For example, a switch block for switching in response to a predetermined control signal may be added to second lines of each layer, or a switch block may be added to a second line (e.g., an extended secondary line) commonly used to input/output data of the layers CA0 to CAn.

Figure 9A:
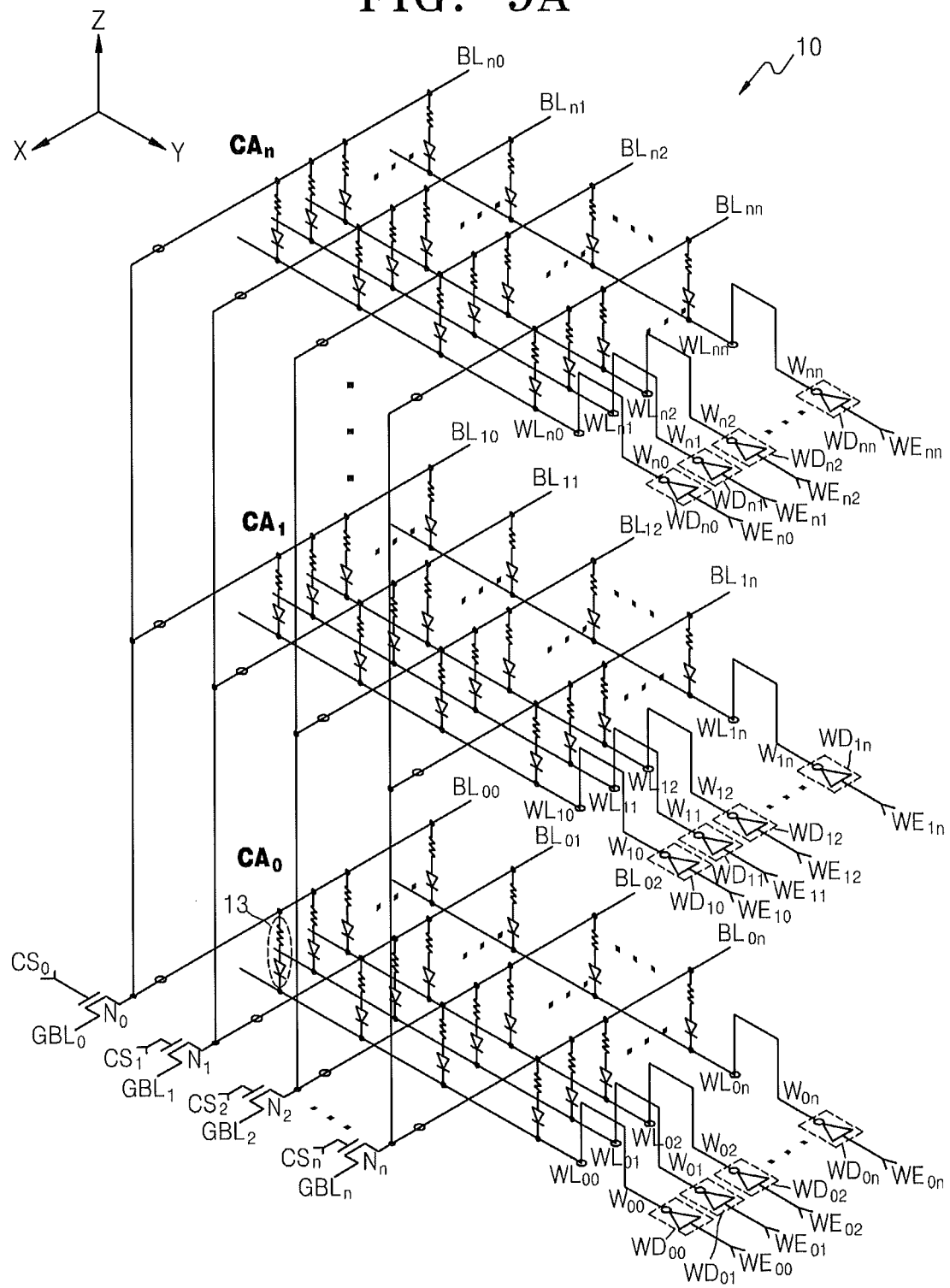
FIGS. 9A and 9B are respectively a detailed circuit diagram and a structural diagram of a semiconductor memory device having a 3D stacked structure according to some embodiments of the present inventive concept.
Figure 9B:
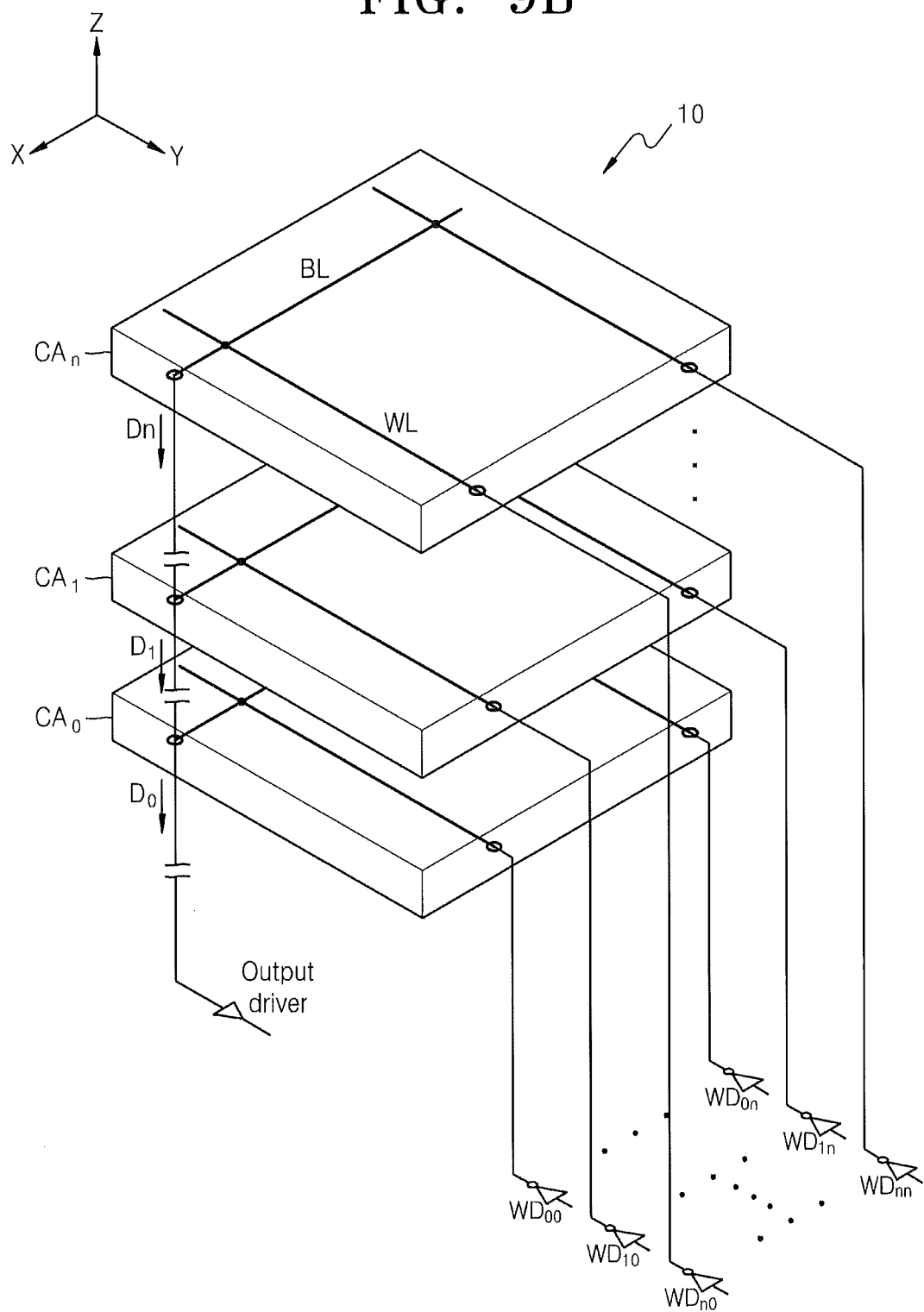

FIGS. 9A and 9B are respectively a detailed circuit diagram and a structural diagram of a semiconductor memory device having a 3D stacked structure according to some embodiments of the present inventive concept.

Since the arrangement of layers CA0 to CAn and second lines BL00 to BLnn is the same as the configuration of FIG. 8, a detailed description thereof will be omitted here. However, since a configuration of first lines WL00 to WLnn and extended first lines W00 to Wnn is different from FIG. 8, this different configuration will now be described.

As shown in FIG. 9A, all of the primary lines WL00 to WLnn disposed in the respective layers CA0 to CAn are independently operated. Furthermore, the extended first lines W00 to Wnn connected to the first lines WL00 to WLnn are also independently operated for the respective layers CA0 to CAn.

Due to these structural characteristics, when an X-address is applied to select a specific memory cell, the number of X-addresses is identical to the number of first lines WL00 to WLnn, and the number of extended first lines W00 to Wnn is also identical to the number of first lines WL00 to WLnn.

The first lines WL00 to WLnn are independently enabled through first line drivers WD00 to WDnn and the extended first lines W00 to Wnn. The number of first line drivers WD00 to WDnn may also be identical to the number of first lines WL00 to WLnn.

Although the first line drivers WD00 to WDnn are disposed in the same plane as the respective layers CA0 to CAn in FIG. 9A, this is only for convenience of description, and the first line drivers WD00 to WDnn may be disposed in an interface area inside or outside the actual memory device 10. Furthermore, the first line drivers WD00 to WDnn may be disposed in a separate chip outside the memory device 10.

A relationship between delivery of an access signal to each layer and a time delay of data from each layer in the memory device 10 of FIG. 9A will now be described with reference to FIGS. 9A and 9B.

The first line drivers WD00 to WDnn for driving the primary lines WL00 to WLnn of the layers CA0 to CAn are disposed. In this case, the first line drivers WD00 to WDnn may be separately disposed in correspondence with the layers CA0 to CAn, respectively. For example, the first line drivers WD00 to WD0$n$ for driving the first lines WL00 to WL0$n$ of the first layer CA0, the first line drivers WD10 to WD1$n$ for driving the first lines WL10 to WL1$n$ of the second layer CA1, and the first line drivers WDn0 to WDnn for driving the first lines WLn0 to WLnn of the (n+1)th layer CAn may be disposed.

Alternatively, the first line drivers WD00 to WDnn may be disposed in a layer (e.g., a layer in which the interface area is disposed) that is different from the layers CA0 to CAn, and the layer in which the interface area is disposed may be disposed below the layers CA0 to CAn. In this case, the first line drivers WD00 to WD0$n$ for the first layer CA0 are connected to the first layer CA0 through the extended first lines W00 to W0$n$, and the first line drivers WD10 to WD1$n$ for the second layer CA1 are connected to the second layer CA1 through the extended first lines W10 to W1$n$.

An access signal is delivered in a direction from a layer (e.g., the (n+1)th layer CAn) for which an output timing is late to a layer (e.g., the first layer CA0) for which an output timing is early so that data output timings of the layers CA0 to CAn are substantially the same. To do this, the first line drivers WDn0 to WDnn for driving the first lines WLn0 to WLnn of the (n+1)th layer CAn are first driven to deliver the access signal to the (n+1)th layer CAn. Thereafter, the access signal is sequentially delivered to the other layers (e.g., the nth layer, the (n−1)th layer, the (n−2)th layer, ..., the second layer, and the first layer) with a predetermined time interval between each layer.

Skew related to the data output timings is compensated for by controlling a delivery time of an access signal to each of the layers CA0 to CAn. For example, the data from the layers CA0 to CAn is provided to an output driver, which may be disposed in the interface area, and data delivery delays occur due to differences in the physical distances between the layers CA0 to CAn and the interface area. When Dn denotes a delay from the (n+1)th layer CAn and D1 denotes a delay from the second layer CA1, Dn is greater than D1. To compensate for this delay difference, a time difference between a delivery time of the access signal to the (n+1)th layer CAn and a delivery time of the access signal to the second layer CA1 is controlled to be (Dn−D1). Since a delay may occur in the delivery of the access signal through the extended first lines W10 to W1$n$, delivery times of the access signal to the (n+1)th layer CAn and the second layer CA1 can be controlled by controlling a driving time of the first line drivers WDn0 to WDnn for the (n+1)th layer CAn and a driving time of the first line drivers WD10 to WD1$n$ for the second layer CA1 The method of controlling access signal delivery times is commonly applied to the other layers.

Meanwhile, to define the data delivery delays, although the description has been disclosed based on a time when data accessed from each layer is delivered to an output driver of the interface area, the present inventive concept is not limited thereto. The interface area may further include a latch (not shown) for temporarily storing the accessed data before delivering the data to the output driver, and the delays may be defined based on a time when the data accessed from each layer is delivered to the latch.

Figure 10:
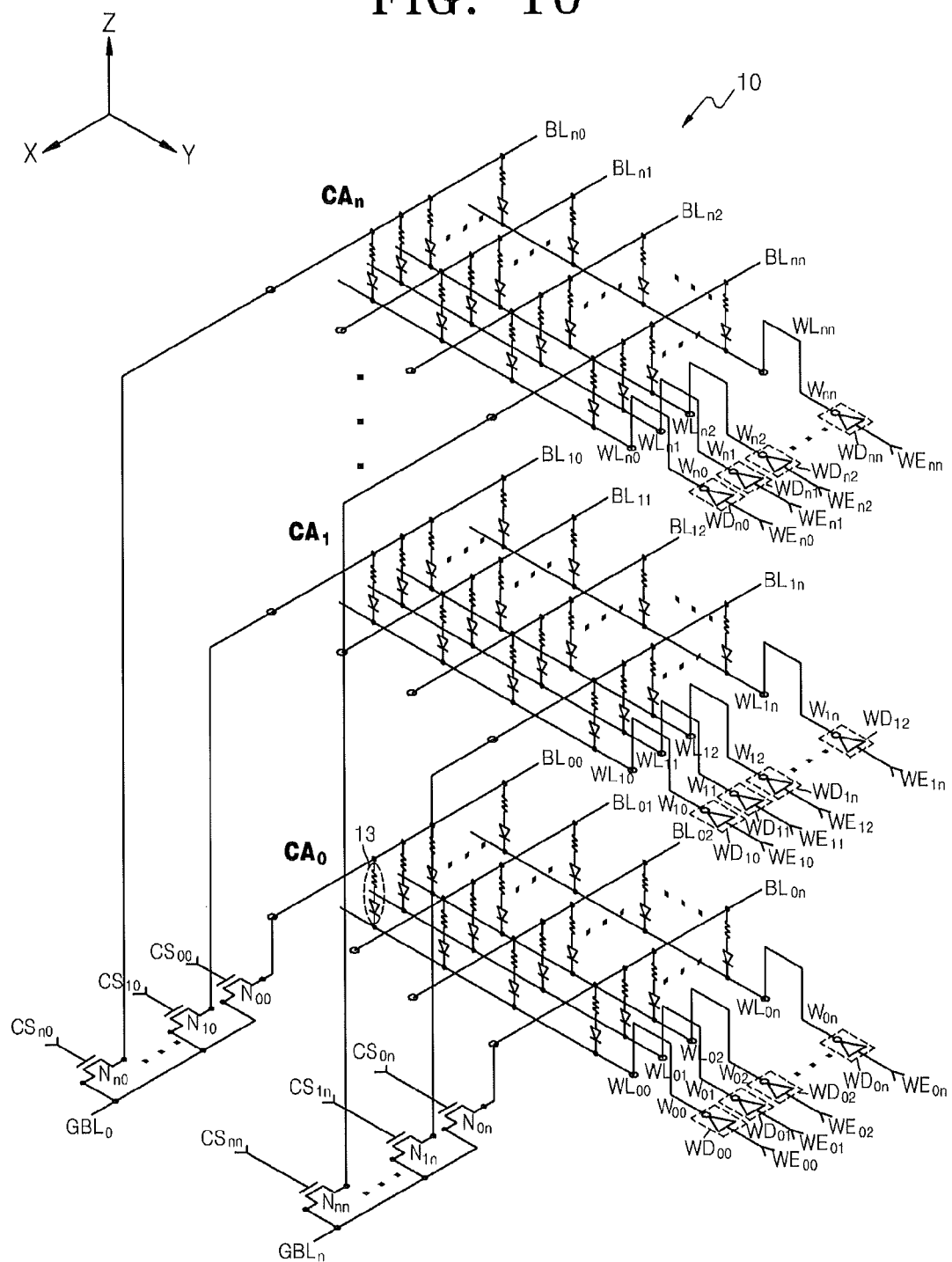
FIG. 10 is a detailed circuit diagram of a semiconductor memory device having a 3D stacked structure according to some embodiments of the present inventive concept.

FIG. 10 is a detailed circuit diagram of a semiconductor memory device having a 3D stacked structure according to another exemplary embodiment of the present inventive concept.

The arrangement of layers CA0 to CAn and second lines BL00 to BLnn is the same as the configuration of FIG. 7A, and a configuration of first lines WL00 to WLnn and extended first lines W00 to Wnn is the same as the configuration of FIG. 9A.

That is, all of the first lines WL00 to WLnn disposed in the respective layers CA0 to CAn are independently operated, and the second lines BL00 to BLnn are also independently operated.

Although FIGS. 7A to 10 described above have differences in that the first lines WL00 to WLnn and the second lines BL00 to BLnn are shared or separated between the layers CA0 to CAn, FIGS. 7A to 10 have the same concept in that inter-layer skew is compensated for by controlling a data input/output time delay per layer through a corresponding access timing.

In addition, although the extended first lines W0 to Wn and W00 to Wnn are disposed in one direction, e.g., the Z axis direction in the above-described embodiments, the extended first lines W0 to Wn and W00 to Wnn can be disposed in any other direction.

The extended first lines W0 to Wn and W00 to Wnn may also be disposed in several directions at the same time, and this will be described below.

FIGS. 11A to 11E are circuit diagrams and structural diagrams of examples in which extended first lines are disposed in both directions of the Y axis.

Figure 11A:
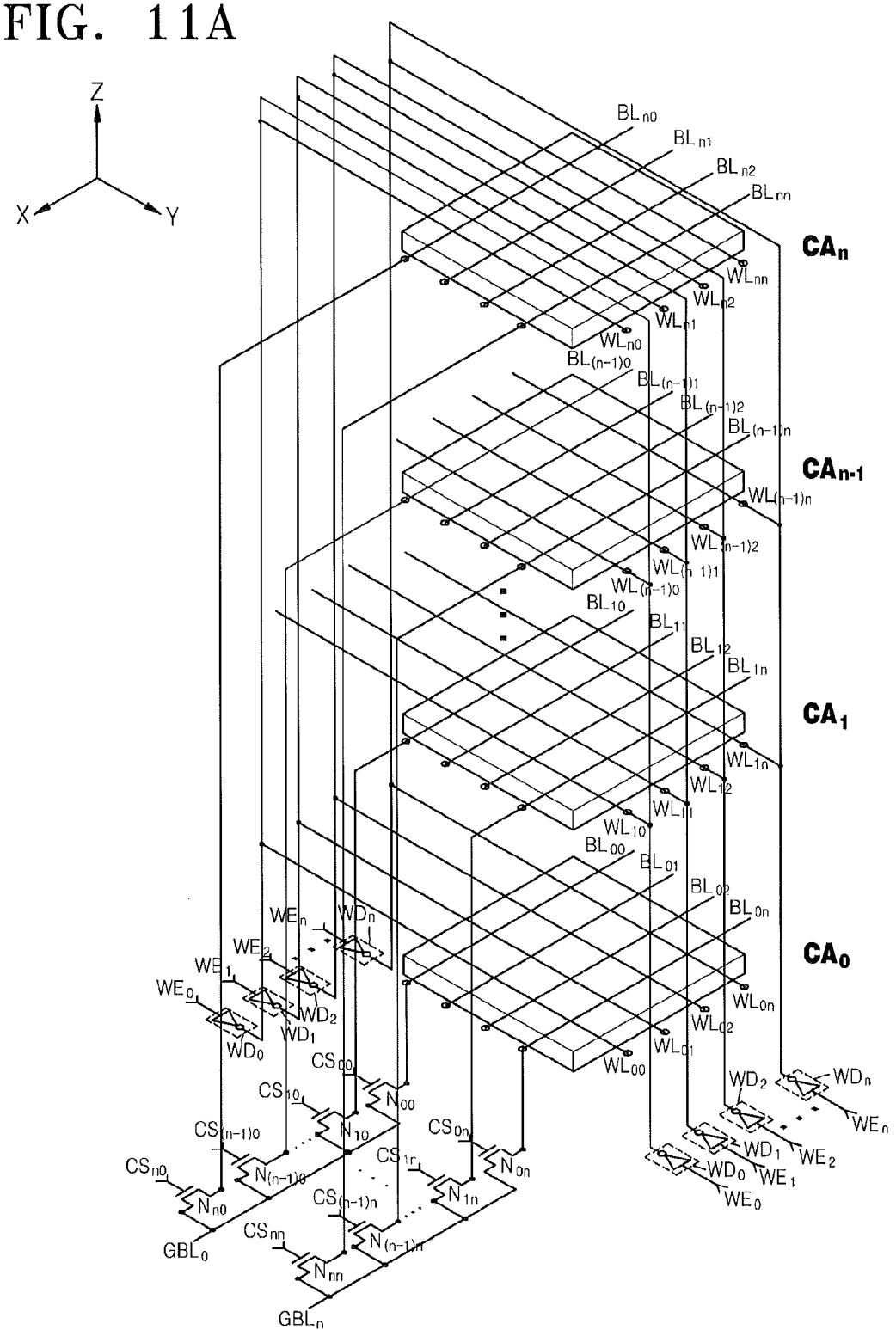
FIGS. 11A to 11E are circuit diagrams and structural diagrams of examples in which extended first lines are disposed in both directions of a Y axis.
Figure 11B:
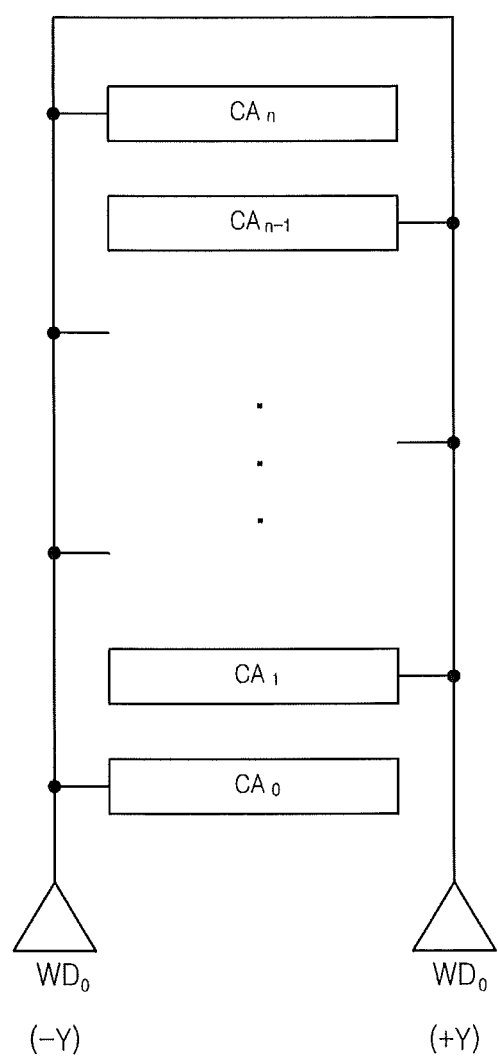

Referring to FIGS. 11A and 11B, first line drivers WD0 to WDn are disposed in both sides of layers CA0 to CAn in the positive Y axis direction and the negative Y axis direction.

In detail, the first line drivers WD0 to WDn disposed in the negative Y axis direction are connected to partial layers (e.g., even-th layers CA1, CA3, CA5, . . . ) in the positive Y axis direction, and the first line drivers WD0 to WDn disposed in the positive Y axis direction are connected to other partial layers (e.g., odd-th layers CA0, CA2, CA4, . . . ) in the negative Y axis direction.

Alternatively, the first line drivers WD0 to WDn disposed in the negative Y axis direction may be connected to the odd-th layers (CA0, CA2, CA4, . . . ) in the same direction (the negative Y axis direction), and the first line drivers WD0 to WDn disposed in the positive Y axis direction may be connected to the even-th layers (CA1, CA3, CA5, . . . ) in the same direction (the positive Y axis direction).

FIG. 11B schematically shows the first line connection structure shown in FIG. 11A, with the first line driver WD0 in the negative Y axis direction and the positive Y axis direction. That is, when the first line drivers WD0 to WDn disposed in any one direction deliver an access signal to the plurality of layers CA0 to CAn, the access signal is delivered to partial layers in the positive Z axis direction with a predetermined interval between each partial layer and then delivered to other partial layers in the negative Z axis direction with the predetermined interval between each of the other partial layers.

Meanwhile, in FIG. 11A, when the total number of layers CA0 to CAn is an odd number, the uppermost layer CAn corresponds to an odd-th layer, and accordingly, the first line drivers WD0 to WDn disposed in the positive Y axis direction and the uppermost layer CAn are connected in the negative Y axis direction. If the total number of layers CA0 to CAn is an even number, the connection diagram shown in FIG. 11A may be changed.

For the above-described connection structure, extended first lines disposed perpendicularly to the surfaces of the layers CA0 to CAn are disposed in both sides of the layers CA0 to CAn, and lines for electrically connecting the extended first lines disposed in both sides to each other may be disposed on the layers CA0 to CAn.

An access signal generated by the first line drivers WD0 to WDn in the negative Y axis direction is delivered across the layers CA0 to CAn through the extended first lines, and the access signal delivered in the positive Y axis direction is delivered to the even-th layers (CA1, CA3, CA5, . . . ). On the other hand, an access signal generated by the first line drivers WD0 to WDn in the positive Y axis direction is delivered across the layers CA0 to CAn through the extended first lines, and the access signal delivered in the negative Y axis direction is delivered to the odd-th layers (CA0, CA2, CA4, . . . ).

That is, the first line drivers WD0 to WDn in the negative Y axis direction are driven to input/output data of the even-th layers (CA1, CA3, CA5, . . . ), and the first line drivers WD0 to WDn in the positive Y axis direction are driven to input/output data of the odd-th layers (CA0, CA2, CA4, . . . ).

When the first line drivers WD0 to WDn in the negative Y axis direction are driven, the access signal is alternately delivered to all of the layers CA0 to CAn. However, an affect due to the above-described time delays is reduced by selecting only second lines corresponding to the even-th layers (CA1, CA3, CA5, . . . ).

When any one first line driver (e.g., driver WD0 in the positive Y axis direction) is operated, a corresponding first line driver in the other side (e.g., driver WD0 in the negative Y axis direction) maintains a high impedance state Hi-Z.

An operation of a 3D semiconductor memory device having the above-described structure is substantially the same as or similar to the structures described with reference to FIGS. 7A to 10. However, a time delay of a data input/output is compensated for by disposing the first line drivers WD0 to WDn in both sides of the layers CA0 to CAn and using the physical arrangement of the extended first lines to deliver an access signal of the first line drivers WD0 to WDn disposed in both sides.

Access control is achieved in an opposite direction to the physical arrangement of the first line drivers WD0 to WDn in FIG. 11A, but access control in the same direction as the physical arrangement can also be performed, and this will now be described.

Figure 11C:
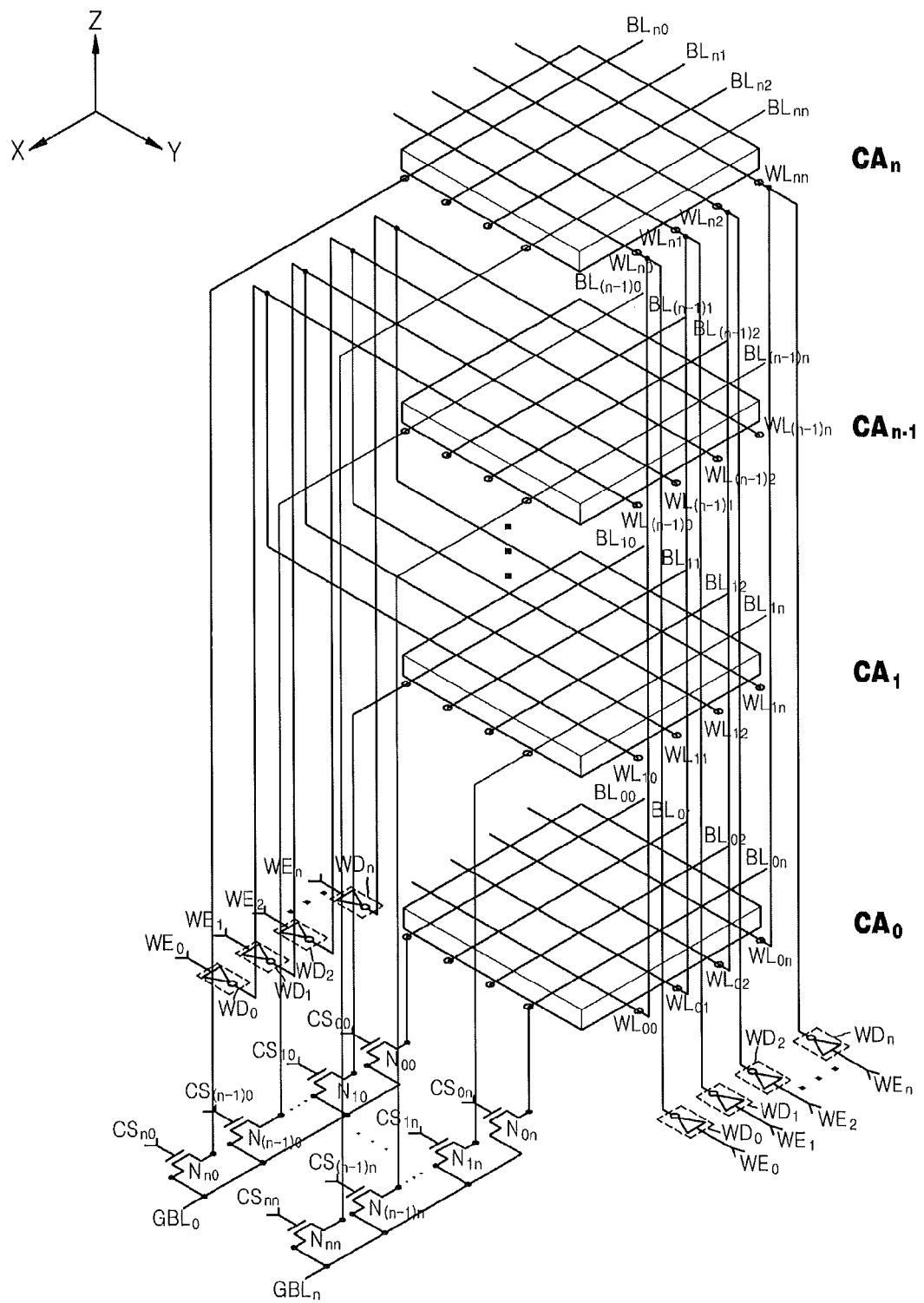

FIG. 11C is a circuit diagram of a modified example of FIG. 11A.

Referring to FIG. 11C, a dummy line structure is arranged so that first line drivers WD0 to WDn in the negative Y axis direction are connected to even-th layers CA1, CA3, CA5, . . . , CAn−1 in the same direction, i.e., the negative Y axis direction.

Similarly, a dummy line structure is arranged so that first line drivers WD0 to WDn in the positive Y axis direction are connected to odd-th layers CA0, CA2, CA4, . . . , CAn in the same direction, i.e., the positive Y axis direction. The first line drivers WD0 to WDn in the negative Y axis direction are driven to input/output data of the even-th layers CA1, CA3, CA5, . . . , CAn−1, and the first line drivers WD0 to WDn in the positive Y axis direction are driven to input/output data of the odd-th layers CA0, CA2, CA4, . . . , CAn.

Figure 11D:
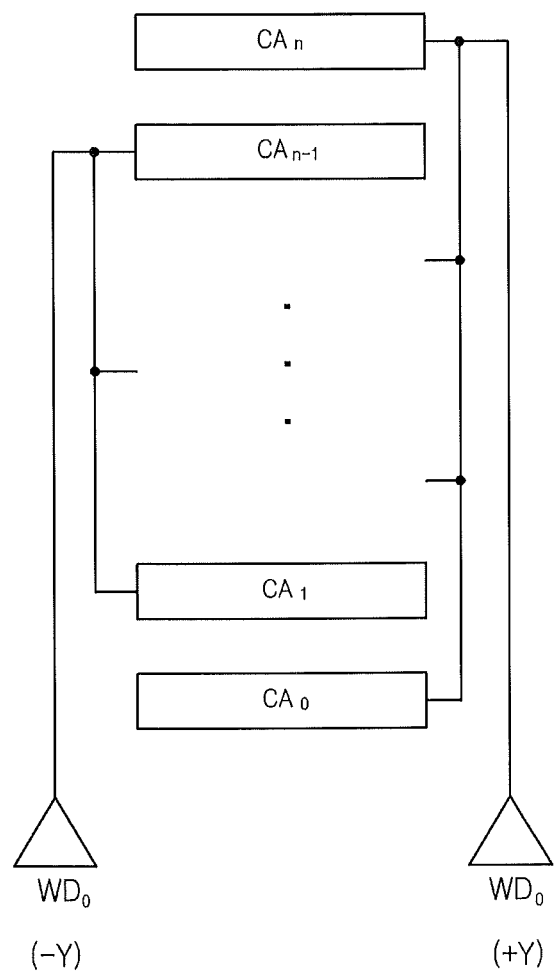

FIG. 11D schematically shows the connection structure of first lines shown in FIG. 11C by using the first line driver WD0 in the negative Y axis direction and the positive Y axis direction.

Figure 11E:
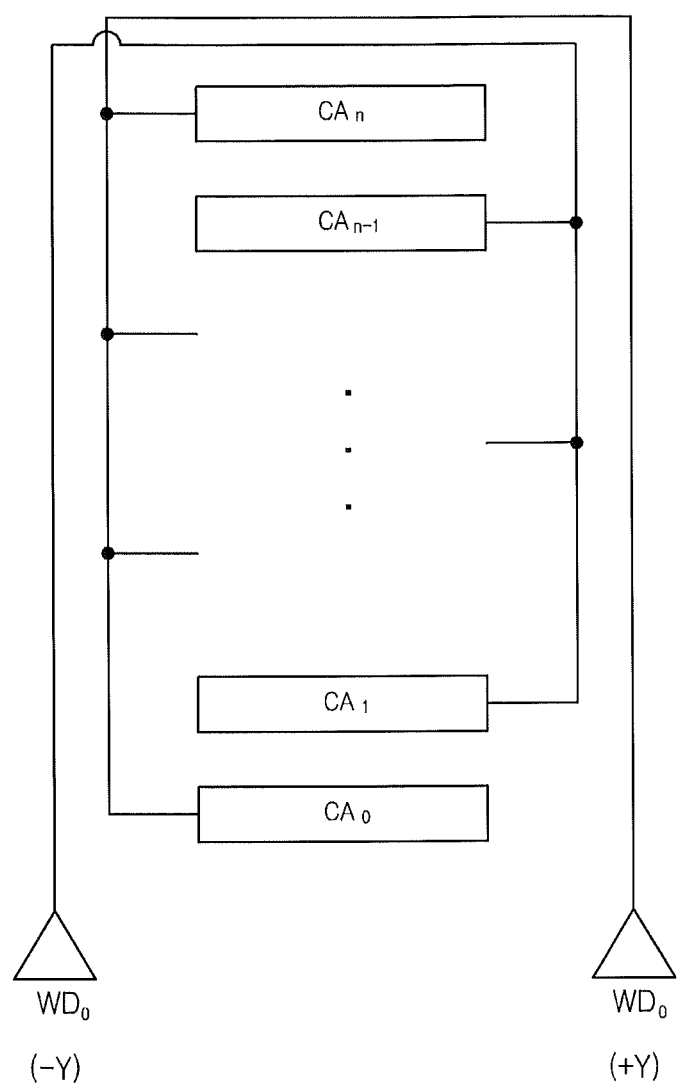

FIG. 11E is a structural diagram of another modified example of FIG. 11A. In FIG. 11E, one first line driver (e.g., WD0) disposed in the negative Y axis direction and the positive Y axis direction is shown, and an access signal of the first line driver WD0 is delivered to the layers CA0 to CAn. Although not shown, the access signal from the first line driver WD0 is delivered to individual first lines (e.g., WL00 to WLn0) of the layers CA0 to CAn.

FIG. 11E shows an example in which the arrangement of lines for delivering an access signal is different from FIG. 11C even though an access signal delivery path is the same as in FIG. 11C. The first line driver WD0 in the negative Y axis direction is connected to partial layers (e.g., CA1, CA3, CA5, . . . ) in another direction (positive Y axis direction). Also, the first line driver WD0 in the positive Y axis direction is connected to partial layers (e.g., CA0, CA2, CA4, . . . ) in the another direction (negative Y axis direction).

Accordingly, when data of the even-th layers (e.g., CA1, CA3, CA5, . . . ) is input/output, the first line driver WD0 in the negative Y axis direction is driven. In this case, since an access signal is delivered to the even-th layers (e.g., CA1, CA3, CA5, . . . ) in reverse order, skew according to a data input/output time delay can be reduced as described above. On the other hand, when data of the odd-th layers (e.g., CA0, CA2, CA4, . . . ) is input/output, the first line driver WD0 in the positive Y axis direction is driven. Likewise, an access signal is delivered to the odd-th layers (e.g., CA0, CA2, CA4, . . . ) in reverse order.

Although first line drivers disposed in any one direction control layers (e.g., odd-th layers) with a predetermined interval therebetween in FIGS. 11A to 11E, the present inventive concept is not limited thereto. For example, the first line drivers WD0 to WDn disposed in any one side (e.g., in the positive Y axis direction) may control first to (n−m)th layers CA0 to CAn−m−1, and the first line drivers WD0 to WDn disposed in the other side (e.g., in the negative Y axis direction) may control (n−m+1)th to (n+1)th layers CAn−m to CAn.

Figure 12A:
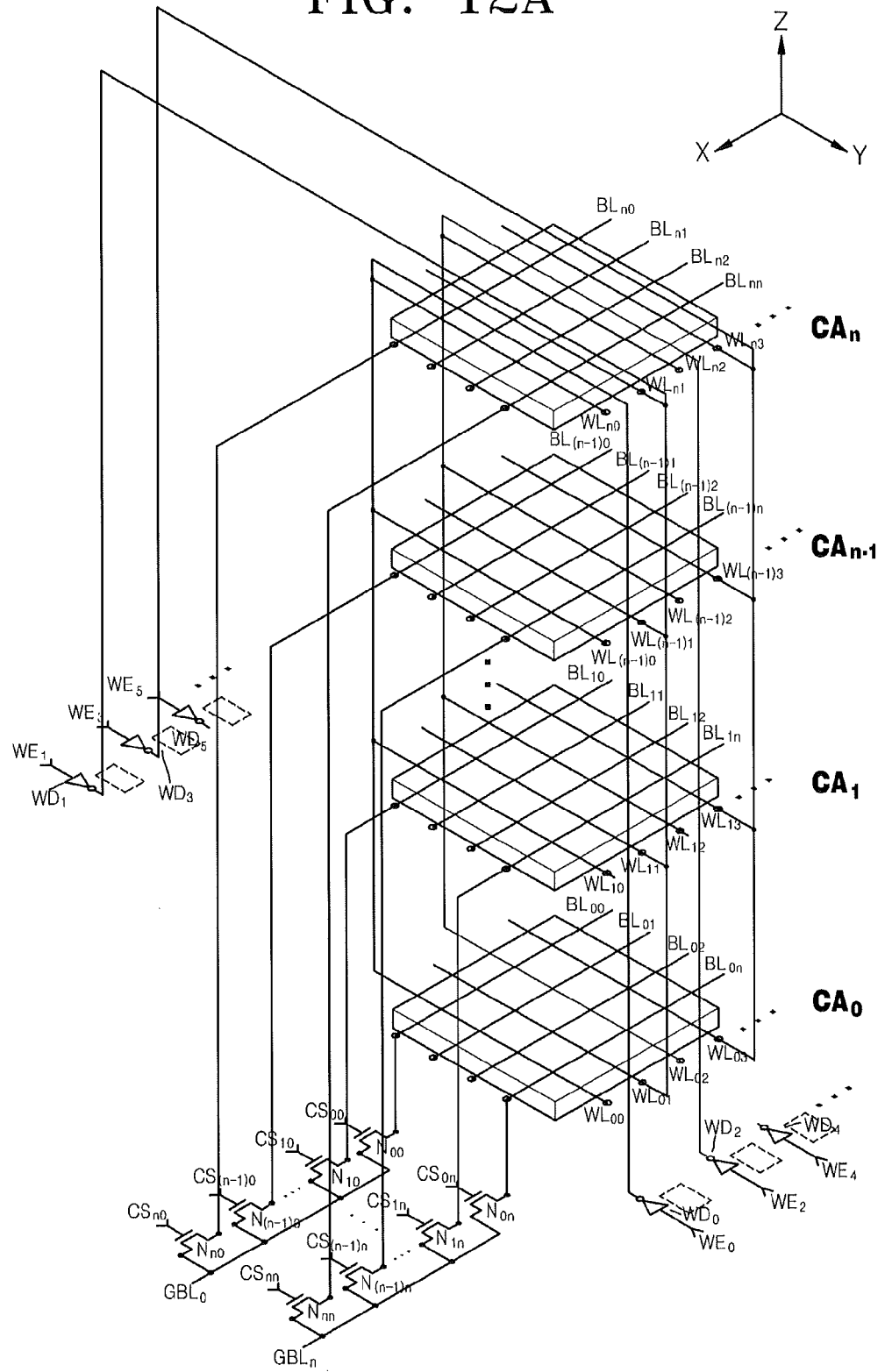
FIGS. 12A and 12B are circuit diagrams of examples in which first line drivers are alternately disposed in both sides of layers in a Y axis direction.
Figure 12B:
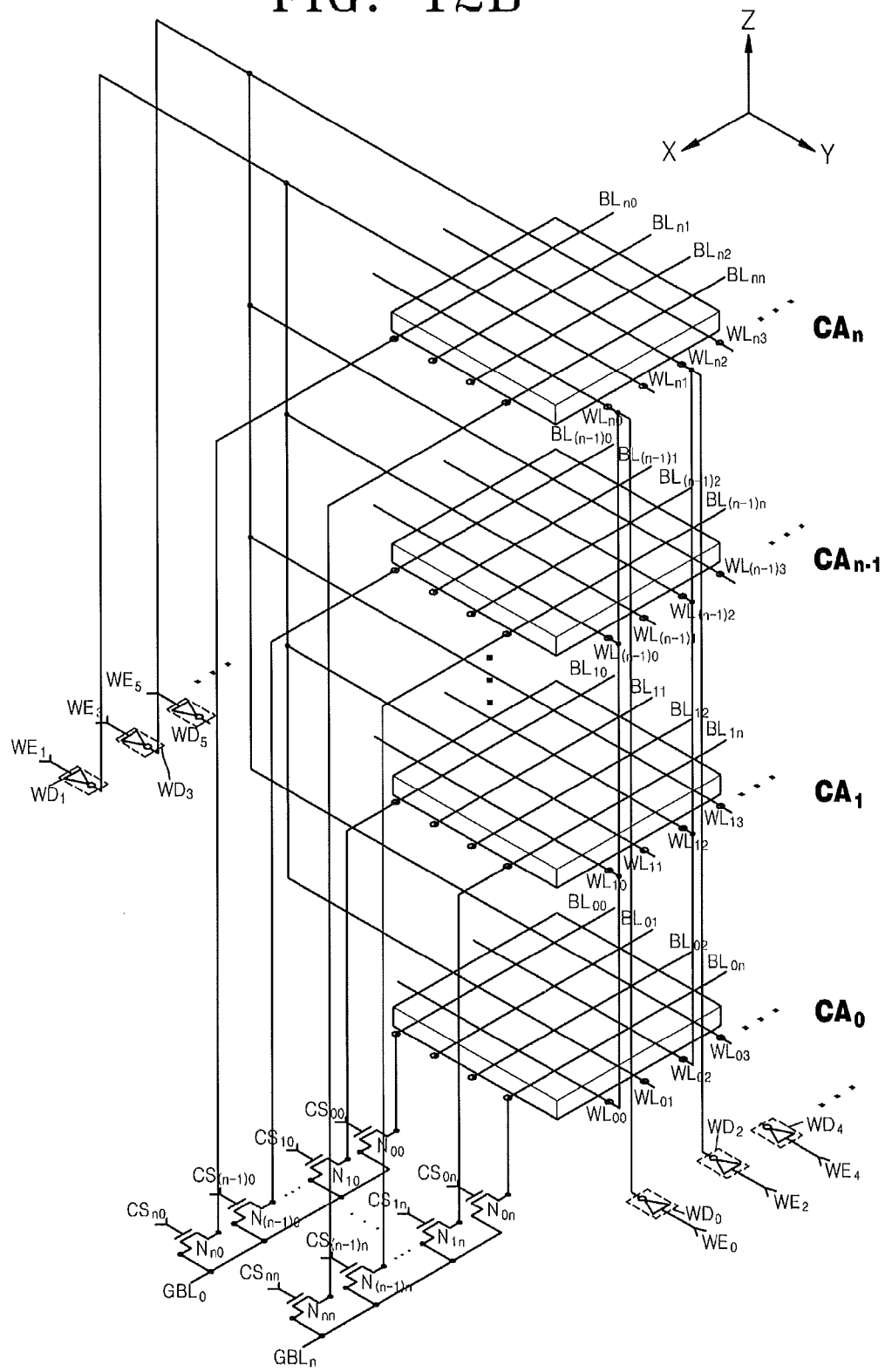

FIGS. 12A and 12B are circuit diagrams of examples in which first line drivers WD0 to WDn are alternately disposed in both sides of layers in the Y axis direction. For example, the even-th first line drivers (WD1, WD3, WD5, . . . ) are disposed in the negative Y axis direction, and the odd-th first line drivers (WD0, WD2, WD4, . . . ) are disposed in the positive Y axis direction.

The even-th first line drivers (WD1, WD3, WD5, . . . ) are connected to the layers CA0 to CAn in the positive Y axis direction, and the odd-th first line drivers (WD0, WD2, WD4, . . . ) are connected to the layers CA0 to CAn in the negative Y axis direction.

Even-th first lines (e.g., WL01, WL03, WL05, . . . of CA0) of each of the layers CA0 to CAn are connected to the first line drivers (WD1, WD3, WD5, . . . ) in the negative Y axis direction, and odd-th first lines (e.g., WL00, WL02, WL04, . . . of CA0) of each of the layers CA0 to CAn are connected to the first line drivers (WD0, WD2, WD4, . . . ) in the positive Y axis direction. An access signal from a first line driver, e.g. WD1, in the negative Y axis direction is delivered to first lines (e.g., WL01 to WLn1) of the layers CA0 to CAn through an extended first line (e.g., W1). In particular, the access signal from the first line driver WD1 is sequentially delivered in a direction from the uppermost layer CAn to the lowest layer CA0.

Similarly, an access signal from a first line driver, e.g. WD0, in the positive Y axis direction, is sequentially delivered through an extended first line (e.g., W0) in a direction from the uppermost layer CAn to the lowest layer CA0.

FIG. 12B has a similar structure to FIG. 12A. However, in the case of FIG. 12B, the first line drivers (WD1, WD3, WD5, . . . ) in the negative Y axis direction are connected to the layers CA0 to CAn in the same direction as the negative Y axis direction and deliver an access signal to even-th first lines (e.g., WL01, WL03, WL05, . . . of CA0).

In addition, the first line drivers (WD0, WD2, WD4, . . . ) in the positive Y axis direction are connected to the layers CA0 to CAn in the same direction (e.g., the positive Y axis direction) and deliver an access signal to odd-th first lines (e.g., WL00, WL02, . . . of CA0).

Although odd-th and even-th first line drivers are separated in FIGS. 12A and 12B, the first line drivers WD0 to WDn may be disposed by grouping the first line drivers WD0 to WDn in another method.

In addition, although the first line drivers WD0 to WDn are connected to the layers CA0 to CAn in the negative Y axis direction and the positive Y axis direction in FIGS. 12A and 12B, the present inventive concept is not limited thereto, and the first line drivers WD0 to WDn may be disposed in various directions according to a layout and connected to the layers CA0 to CAn.

In the examples of FIGS. 11A to 12B, whether adjacent top and bottom layers (e.g., CA0 and CA1) share the second lines BL00 to BLnn has not been discussed. However, when adjacent top and bottom layers (e.g., CA0 and CA1) share the second lines BL00 to BLnn, the adjacent top and bottom layers may act as a leakage path between each other, so a modified structure may be necessary.

Figure 13:
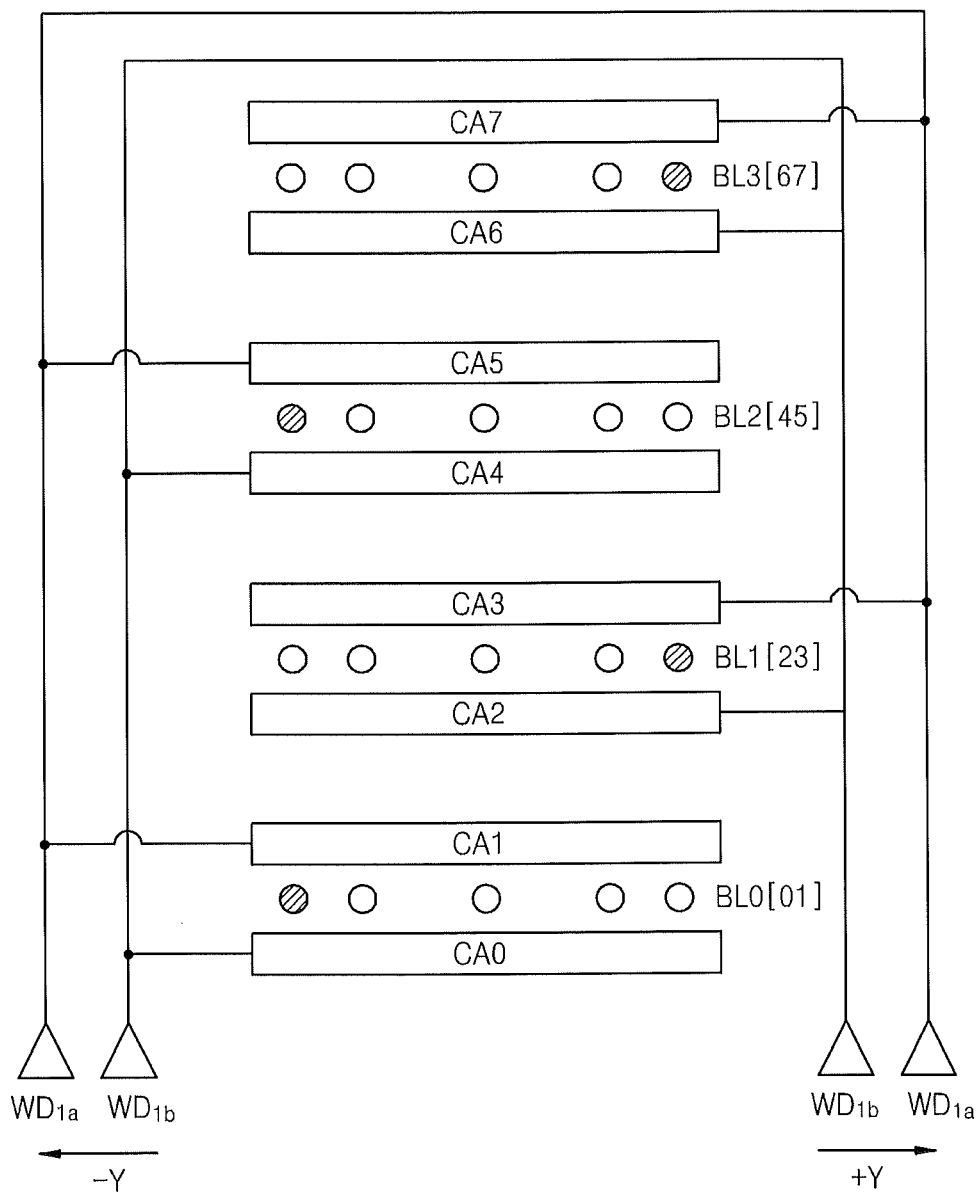
FIG. 13 is a schematic diagram of an example in which adjacent top and bottom layers share second lines.

FIG. 13 is a schematic diagram of an example in which adjacent top and bottom layers share second lines.

Referring to FIG. 13, 8 layers CA0 to CA7 are stacked, second lines BL0 to BL7 for data input/output are disposed in the layers CA0 to CA7, and adjacent top and bottom layers (e.g., CA0 and CA1, CA2 and CA3, CA4 and CA5, and CA6 and CA7) share the second lines BL0 to BL7.

In the case of a memory cell stacked structure of the layers CA0 to CA7, although not shown, each of the layers CA0 to CA7 may further include a first line for cell access and a cell for storing data.

Since the layers CA0 and CA1, CA2 and CA3, CA4 and CA5, and CA6 and CA7 share the second lines BL0 to BL3, the structure of the shared-second line may result in a current leakage during inputting/outputting of data or inputting/outputting of data of one layer may be affected by an adjacent layer. In this case, first line drivers WD1$a$ and WD1$b$ are divided into two pairs and controlled. For example, the first line drivers WD1$a$ and WD1$b$ may be disposed in the negative Y axis direction and the positive Y axis direction.

When data is input to or output from cells of the first layer CA0 and the second layer CA1 or the fifth layer CA4 and the sixth layer CA5, i.e., generally corresponding cells of a (4n+1)th layer CA4$n$ and a (4n+2)th layer CA4$n$+1 (where n is a natural number including 0), first lines (not shown) are accessed through the first line drivers WD1$a$ and WD1$b$ located in the positive Y axis direction, and the data is input or output through corresponding second lines BL0 and BL2.

When data is input to or output from cells of the third layer CA2 and the fourth layer CA3 or the seventh layer CA6 and the eighth layer CA7, i.e., generally corresponding cells of a (4n+3)th layer CA4$n$+2 and a 4(n+1)th layer CA4$n$+3, first lines (not shown) are accessed through the first line drivers WD1$a$ and WD1$b$ located in the negative Y axis direction, and the data is input or output through corresponding second lines BL1 and BL3.

Although adjacent top and bottom layers share second lines in FIG. 13, more layers may share second lines, and in this case, more pairs of first line drivers may be disposed.

Figure 14:
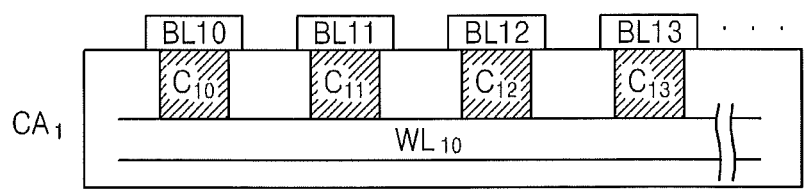
FIG. 14 is a cross sectional diagram for schematically showing a relationship between two adjacent top and bottom layers.
Figure 14:
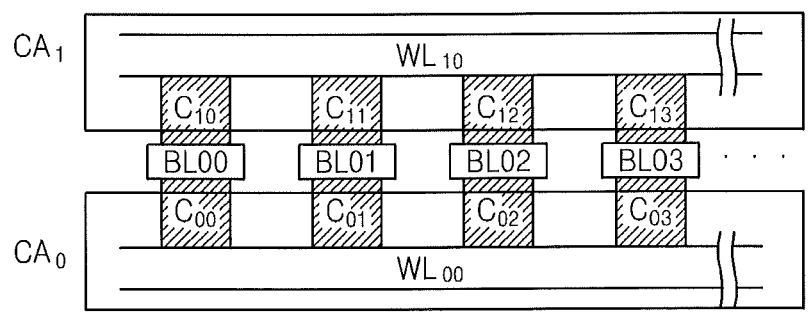

FIG. 14 is a cross sectional diagram for schematically showing a relationship between two adjacent top and bottom layers.

Referring to portion (a) of FIG. 14, second lines BL00 to BL13 are separated for two adjacent top and bottom layers CA0 and CA1. Here, a memory having a 3D stacked structure is illustrated, wherein a plurality of memory cells C00 to C13, first lines WL00 and WL10 for controlling an access to the plurality of memory cells C00 to C13, and the second lines BL00 to BL13 for inputting/outputting data are disposed.

Referring to portion (b) of FIG. 14, the adjacent top and bottom layers CA0 and CA1 share the second lines BL00 to BL03. In addition, the plurality of memory cells C00 to C13, the first lines WL00 and WL10 for controlling an access to the plurality of memory cells C00 to C13, and the second lines BL00 to BL03 for inputting/outputting data are disposed.

If a plurality of layers are stacked, first lines, second lines, and first line drivers may be added according to the increase of the number of stacks. However, this may result in design limits in a layout. As a solution, layers having similar access timings may be grouped and controlled.

Figure 15:
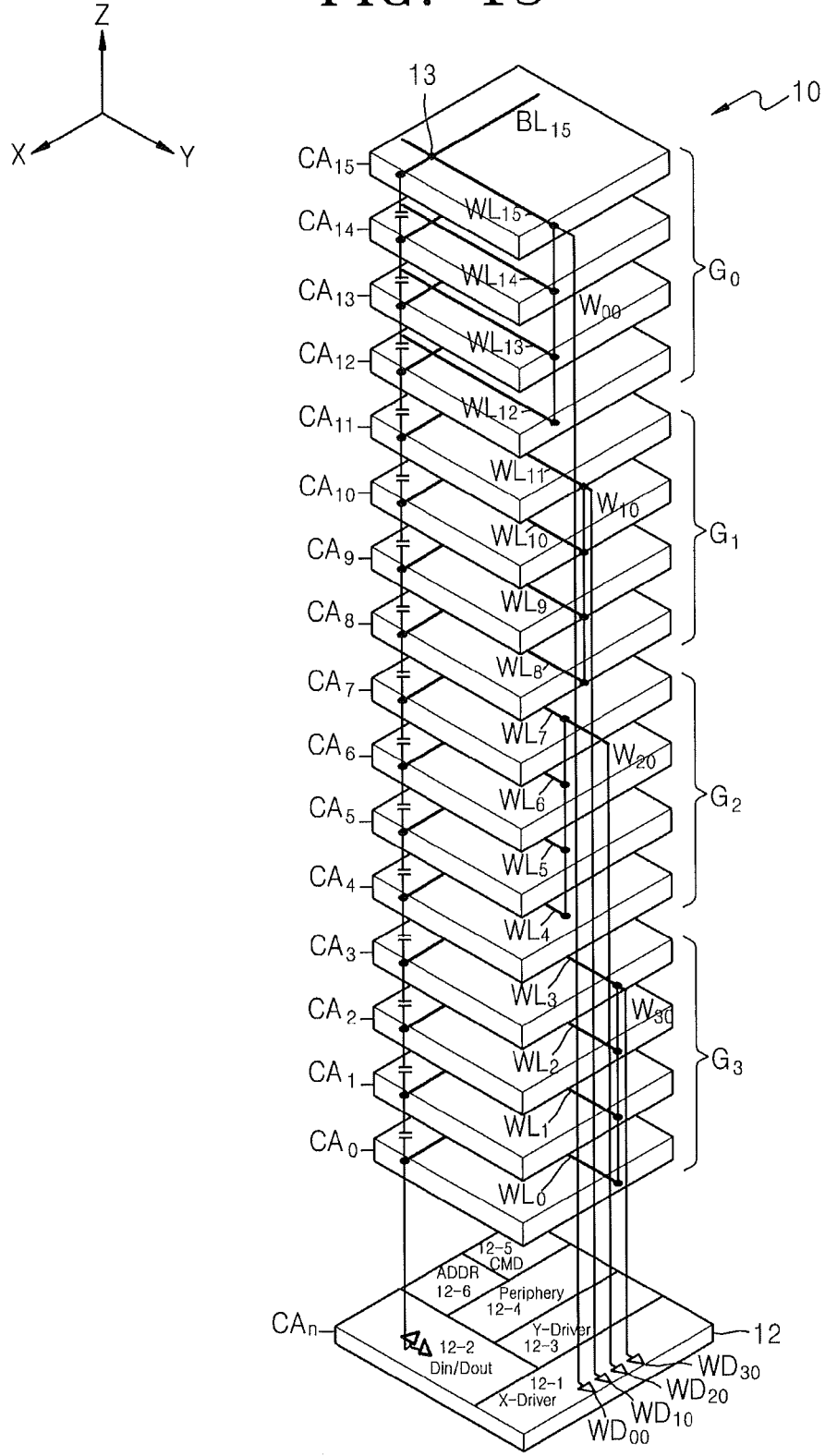
FIG. 15 is a block diagram for describing an example of controlling skew by grouping access timings of layers.

FIG. 15 is a block diagram for describing an example of controlling skew by grouping access timings of layers.

Referring to FIG. 15, a semiconductor device 10 includes a first semiconductor area G0 to G3 including 16 layers CA0 to CA15 having a stacked structure. In addition, a second semiconductor area 12 for interfacing is disposed below a first layer CA0.

Since a configuration of the second semiconductor area 12 is similar to that of FIG. 3 and associated reference numerals may be the same, a detailed description thereof will be omitted here.

A total of 4 groups are designated by grouping 4 layers (CA0 to CA3, CA4 to CA7, CA8 to CA11, and CA12 to CA15) having similar data input/output time delays as one group. This grouping may be performed by making the number of layers the same or different for each group according to a given condition.

A first group G0 having the largest time delay due to the physical distance from the second semiconductor area 12 is comprised of the uppermost 4 layers CA12 to CA15. A second group G1 is disposed below the first group G0, and a time delay of the second group G1 is smaller than the first group G0.

A third group G2 is disposed below the second group G1, and a time delay of the third group G2 is smaller than the second group G1. A fourth group G3 is disposed below the third group G2, and a time delay of the fourth group G3 is the smallest in the entire groups G0 to G3.

First lines WL0 to WL15 in the same position (the same X and Y addresses) are controlled through first line drivers WD00 to WD30 shared by the groups G0 to G3. In this case, the first line drivers WD00 to WD30 are commonly connected to each of the groups G0 to G3 through extended first lines W00 to W30.

When access timing control is performed for each group, the extended first lines W00 to W30 may be used as described above and/or may not be used. That is, since access timing control can be performed for each group, the extended first lines W00 to W30 may not be used.

Besides the timing control for each of the groups G0 to G3, since a minute difference may occur between data input/output time delays in each group, fine control for the extended first lines W00 to W30 may be further performed.

This timing control for each of the groups G0 to G3 is applicable to not only the embodiments described above, e.g., a structure sharing or separating first lines and/or second lines, but also an embodiment in which at least one pair of first line drivers WD0 to WD 3 are disposed in both sides of the layers.

Alternatively, skew may be compensated for by controlling a layout in a control unit without performing the timing control for each of the groups G0 to G3. For example, this can be achieved by designing a length of a layout connected to a layer having the largest delay time to be the shortest and an opposite case to be the longest.

Figure 16:
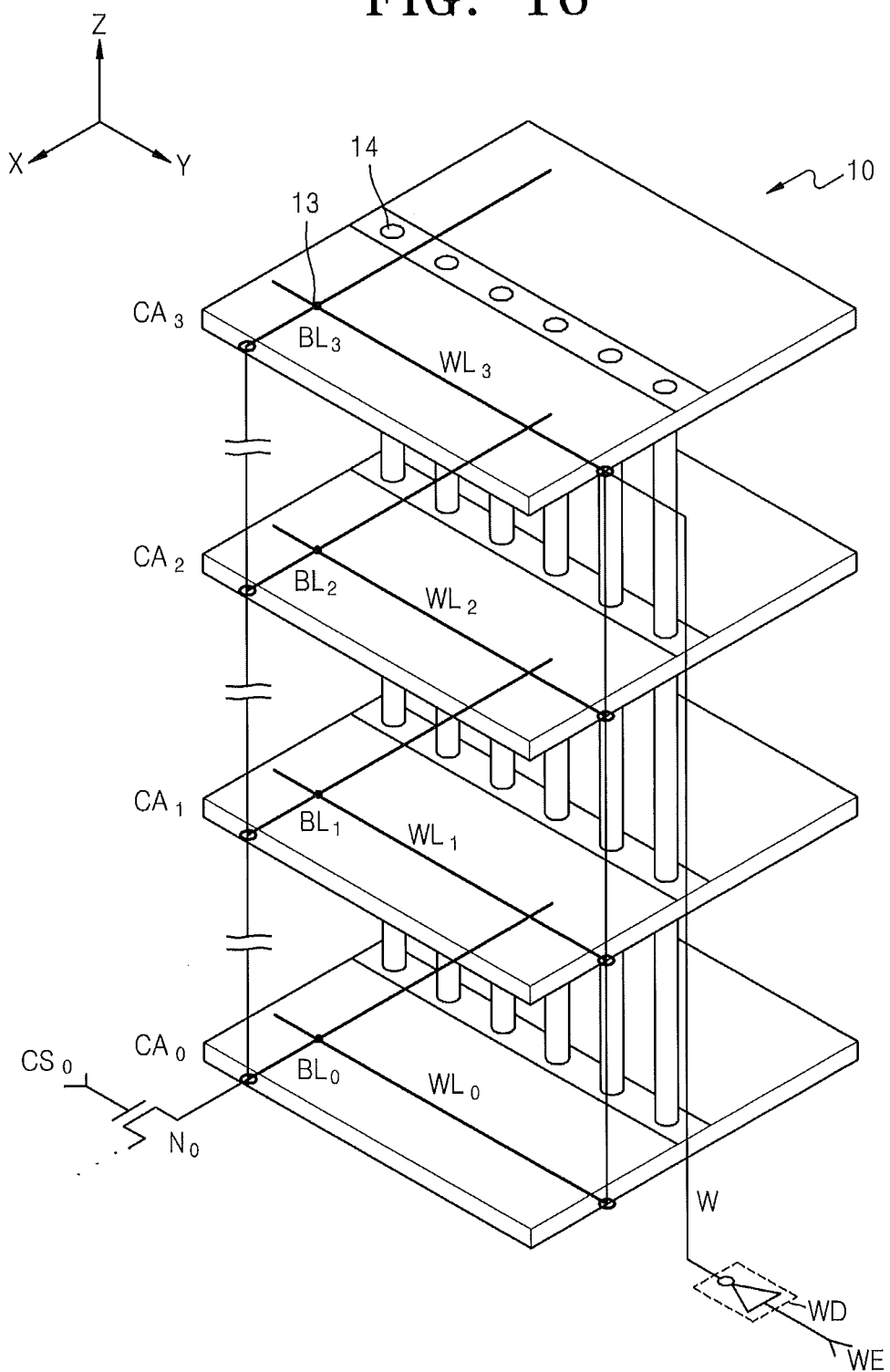
FIG. 16 is a side perspective view for schematically showing an application example of a 3D semiconductor device stacked using a through-silicon via (TSV)

FIG. 16 is a side perspective view for schematically showing an application example of a 3D semiconductor device 10 stacked using a through-silicon via (TSV) 14.

Although a DRAM memory cell array is illustrated in FIG. 16, embodiments described herein are applicable to a stacked structure and/or a combined structure of a volatile or nonvolatile memory, such as an SRAM, an RRAM, a PRAM, and/or an MRAM.

A memory area of the semiconductor device 10 is comprised of, for example, 4 stacked layers CA0 to CA3 connected through the TSV 14. Here, each of the layers CA0 to CA3 may be a single wafer, or all of the layers CA0 to CA3 may be stacked on the same wafer.

The layers CA0 to CA3 share a data line, a control line, and a power line and are connected to an external control unit or interface unit through the TSV 14.

Each of the layers CA0 to CA3 includes first lines WL0 to WL3 (e.g., wordlines) for accessing a memory cell 13, second lines BL0 to BL3 (e.g., bitlines) for inputting or outputting data to or from the memory cell 13, and the memory cell 13 located at a cross point of the first lines WL0 to WL3 and the second lines BL0 to BL3.

A first line driver WD is disposed in the control unit included in an external or the stacked structure. The first line driver WD enables or disables the corresponding first lines WL0 to WL3 of the respective layers CA0 to CA3 by a first line enable signal WE. By sequentially enabling the first lines WL0 to WL3 from the first line WL3 located in the layer CA3 having the latest access timing (or the longest data input/output time delay) through an extended first line W, skew due to an inter-layer data input/output time delay difference, which occurs due to a physical position, can be compensated for.

Even in the TSV structure shown in FIG. 16, control using a single primary line driver pair and control using grouping of layers can be performed.

As described above, it has been described through several embodiments that skew that occurs due to the physical structure can be compensated for through a physical arrangement or a software method for a 3D stacked memory device. Meanwhile, a verification or test of whether skew has been compensated for is required, so a test and calibration process for skew compensation will now be described.

Figure 17:
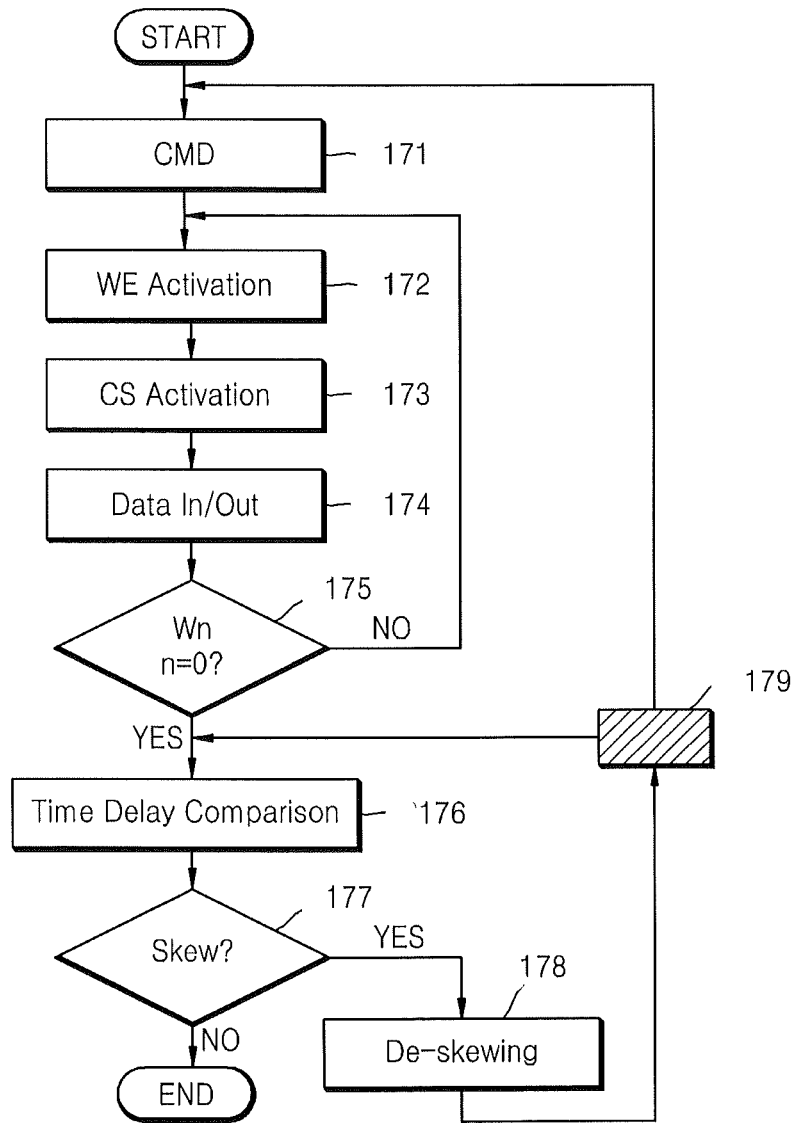
FIG. 17 is a flowchart of a test and calibration process for skew compensation of a 3D semiconductor memory device.

FIG. 17 is a flowchart of a test and calibration process for skew compensation of a 3D semiconductor memory device.

Although a read or write operation of a memory device is illustrated in FIG. 17, this test process is applicable not only to a memory device but also to any semiconductor device having a 3D stacked structure.

Referring to FIG. 17, in operation 171, a read or write command CMD is input from the outside, e.g., a memory controller, to a memory device having a 3D stacked structure. In operation 172, a wordline enable signal corresponding to an address of a corresponding cell for which read or write is going to be performed is activated after a predetermined decoding process is performed.

A read operation will be described herein as an example.

Data of the corresponding cell is output in operation 174 by selectively controlling On/OFF of a bitline selection transistor through a bitline selection signal CS in operation 173.

As shown in the above-described embodiments, wordlines are sequentially activated from a wordline WLn of a layer far from a controller or an interface chip. If data of all layers is completely output in operation 175, time delays of data output from all of the layers are compared with each other in operation 176. This time delay operation may be performed by comparing delay amounts between a time of driving a primary line and a time of ending a data delivery through a secondary line of each layer. As an inter-layer time delay difference is small, it is indicated that skew is reduced.

Here, this time delay comparison may be performed for only representative specific layers without performing the test for all of the layers.

Optionally, in the time delay comparison, data may be simultaneously output from a plurality of layers and compared with each other, or time delays may be sequentially calculated and compared with each other.

As a result of the time delay comparison between layers in operation 177, if there is no skew, or if skew is within an acceptable range, the test process ends.

If skew exceeds the acceptable range, a de-skewing process is further performed in operation 178, and the above-described procedures are repeated.

The de-skewing process in operation 178 may be performed through compensation by a separate delay or an extended layout using an electrical fuse for each layer in the interface chip or performed through CDR or per-pin skew compensation.

Here, the above-described full process of outputting data of all of the layers may be performed again, or only the procedures of comparing time delays may be performed again in operation 179.

Although a de-skewing test process is performed by a read or write command from the outside in the current embodiment, the process performed by a command from the outside may also be performed in a series of operations performed in a system initialization process or performed by a periodical command from the outside or in a wake-up process after power down.

In addition, the de-skewing test and calibration may be periodically performed using a counter included in an interface chip in a structure in which a 3D memory device is a separate chip or is combined with the interface chip, and the test and calibration may be adaptively performed through time delay detection at all times.

Figure 18:
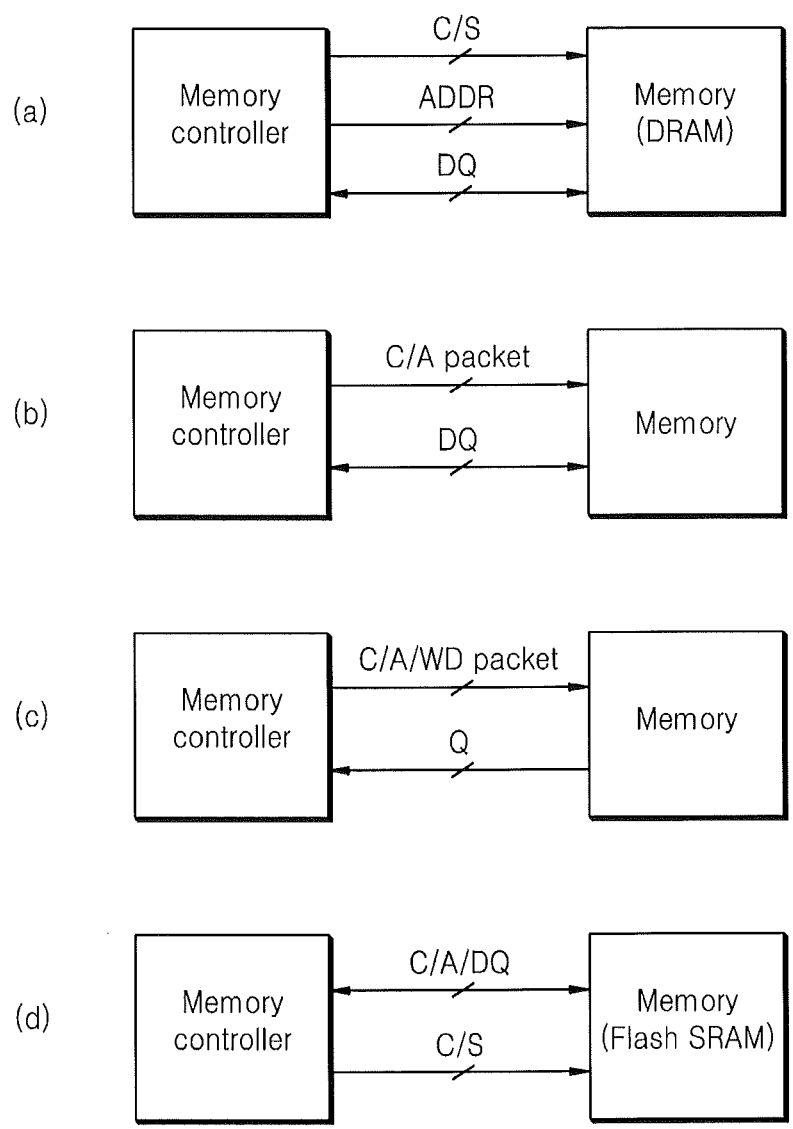
FIG. 18 is a block diagram of application examples of the present inventive concept connected to a memory controller.

FIG. 18 is a block diagram of application examples of the present inventive concept connected to a memory controller, in which various types of memory bus protocols are disclosed.

Referring to portion (a) of FIG. 18, a bus protocol between a memory controller and a memory, e.g., DRAM, is disclosed. A control signal C/S, such as /CS, CKE, /RAS, /CAS, or /WE, and an address signal ADDR are provided from the memory controller to the memory. Data DQ is transmitted in both directions.

Referring to portion (b) of FIG. 18, packetized control and address signals C/A packet are provided from a memory controller to a memory, and data DQ is transmitted in both directions.

Referring to portion (c) of FIG. 18, packetized control, address, and write data signals C/A/WD packet are provided from a memory controller to a memory, and data D is transmitted from the memory to the memory controller in one direction.

Referring to portion (d) of FIG. 18, a control signal C/S is provided from a memory controller to a memory, e.g., flash SRAM, and a command, an address, and data C/A/DQ are transmitted in both directions.

Figure 19:
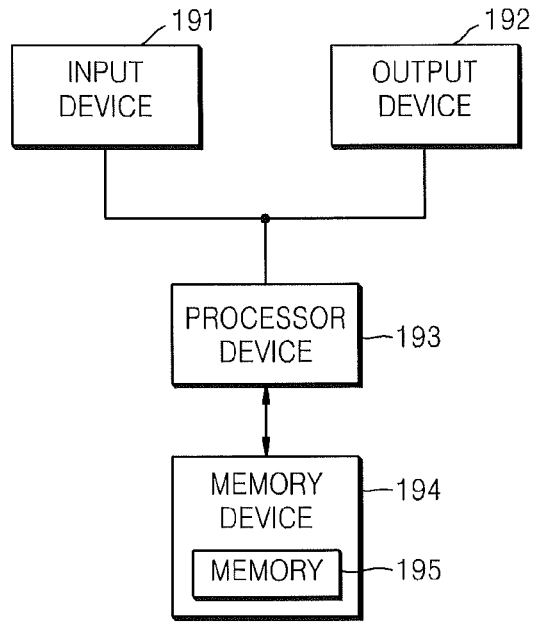
FIG. 19 is a block diagram of an application example of an electronic system including a semiconductor memory device having a 3D stacked structure.

FIG. 19 is a block diagram of an application example of an electronic system including a semiconductor memory device having a 3D stacked structure according to some embodiments of the inventive concept.

Referring to FIG. 19, the electronic system includes an input device 191, an output device 192, a memory device 194, and a processor device 193.

The memory device 194 includes an interface chip and/or a memory controller and a memory 195 having a 3D stacked structure. The interface chip and/or the memory controller may form a 3D stacked structure with the memory 195.

The processor device 193 controls a general operation by being connected to the input device 191, the output device 192, and the memory device 194 through corresponding interfaces.

Figure 20:
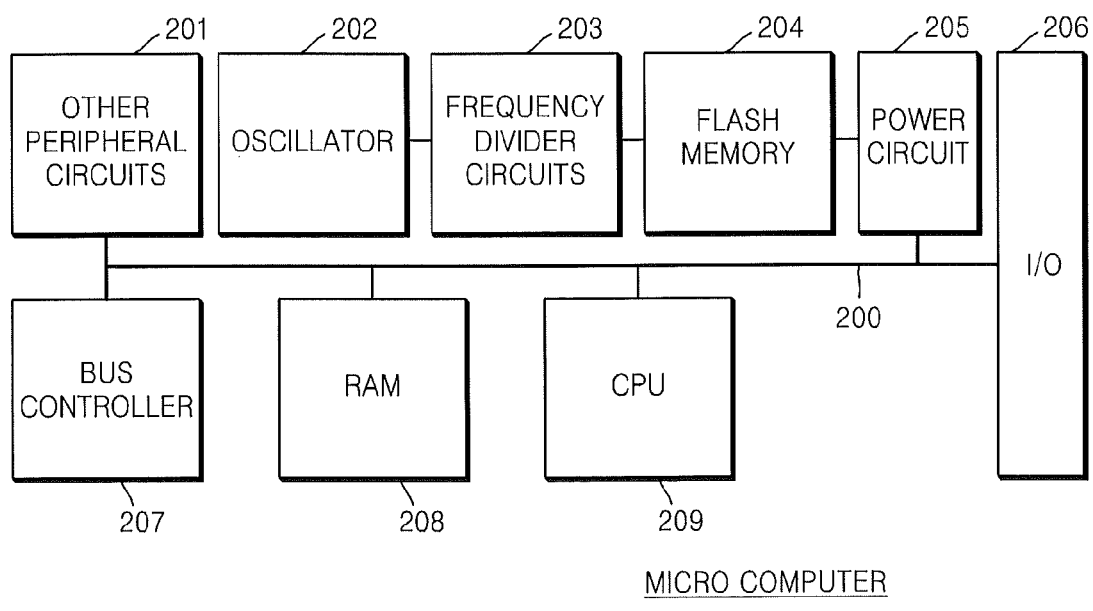
FIG. 20 is a block diagram of an application example of a single-chip microcomputer including a semiconductor memory device having a 3D stacked structure.

FIG. 20 is a block diagram of an application example of a single-chip microcomputer including a semiconductor memory device having a 3D stacked structure.

Referring to FIG. 20, the circuit module type microcomputer includes a central processing unit (CPU) 209, a memory 208, e.g., RAM, having a 3D stacked structure, which is used as a work area of the CPU 209, a bus controller 207, an oscillator 202, a frequency divider 203, a flash memory 204, a power circuit 205, an input/output port 206, and other peripheral circuits 201 including a timer counter, which are connected through an internal bus 200.

The CPU 209 includes a command control part (not shown) and an execution part (not shown), decodes a fetched command through the command control part, and performs a processing operation through the execution part according to a decoding result.

The flash memory 204 stores various kind of data including, but not limited to an operation program or data of the CPU 209. The power circuit 205 generates a high voltage required for erase and write operations of the flash memory 204.

The frequency divider 203 provides reference clock signals and other internal clock signals by dividing a source frequency provided from the oscillator 202 into a plurality of frequencies.

The internal bus 200 includes an address bus, a data bus, and a control bus.

The bus controller 207 controls bus access corresponding to the number of determined cycles in response to an access request from the CPU 209. Here, the number of access cycles is related to a wait state and a bus width corresponding to an accessed address.

When the microcomputer is mounted on the top of a system, the CPU 209 controls the erase and write operations of the flash memory 204. In a test or manufacturing stage of a device, the erase and write operations of the flash memory 204 can be directly controlled through the input/output port 206 as an external recording device.

Figure 21:
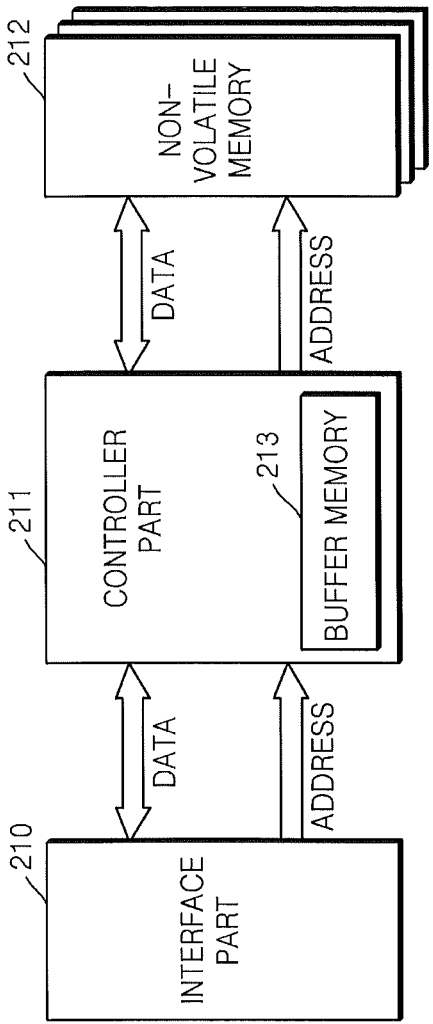
FIGS. 21 and 22 are block diagrams of application examples of a memory card to which a 3D stacked semiconductor memory device of the present inventive concept is applied when the 3D stacked semiconductor memory device is nonvolatile.
Figure 22:
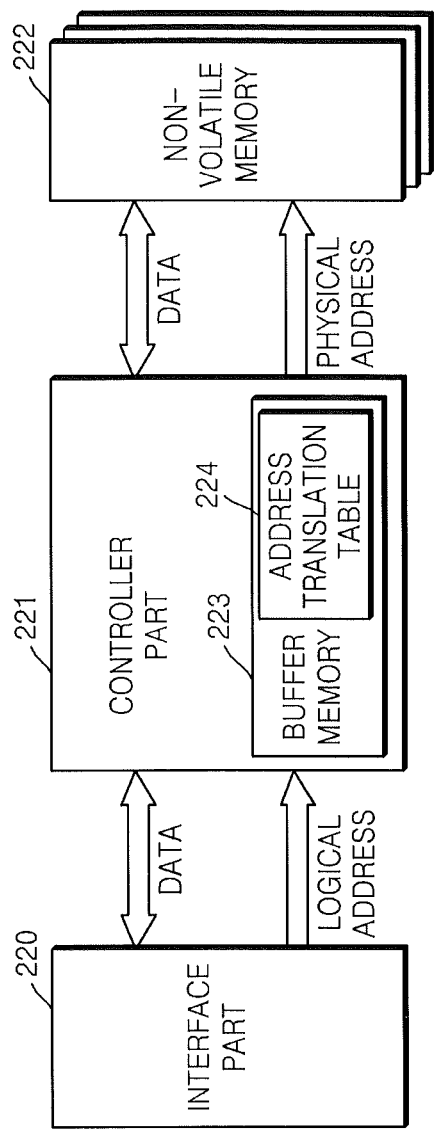

FIGS. 21 and 22 are block diagrams of application examples of a memory card to which a 3D stacked semiconductor memory device of the present inventive concept is applied when the 3D stacked semiconductor memory device is nonvolatile.

Referring to FIGS. 21 and 22, the memory card includes an interface part 210 or 220 for interfacing with the outside, a controller 211 or 221, which includes a buffer memory and controls an operation of the memory card, and at least one nonvolatile memory 212 or 222 having a 3D stacked structure.

The nonvolatile memory 212 or 222 includes a structure by which skew between stacked layers is compensated for as described above.

The controller 211 or 221 is connected to the interface part 210 or 220 through a data bus DATA and an address bus ADDRESS and is also connected to the nonvolatile memory 212 or 222 through a data bus DATA and an address bus ADDRESS.

In the example shown in FIG. 22, the memory card includes an address translation table 224, which corresponds to a logic address input from the outside or a physical address of the nonvolatile memory 222, in the controller 221, in detail, in the buffer memory 223 of the controller 221.

For example, when a write operation is performed, new data is written in an arbitrary physical address to update the address translation table 224.

The memory card having the address translation table 224 can select a physical address for providing a memory array by which a write operation can be performed.

Figure 23:
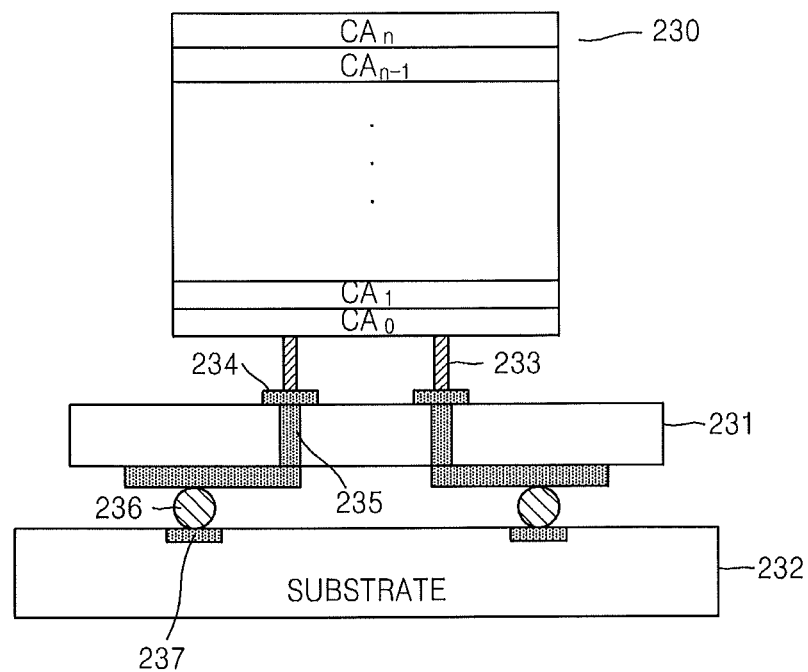
FIGS. 23 to 25 are cross sectional diagrams of application examples in which a semiconductor memory device having a 3D stacked structure is integrated in various ways.
Figure 24:
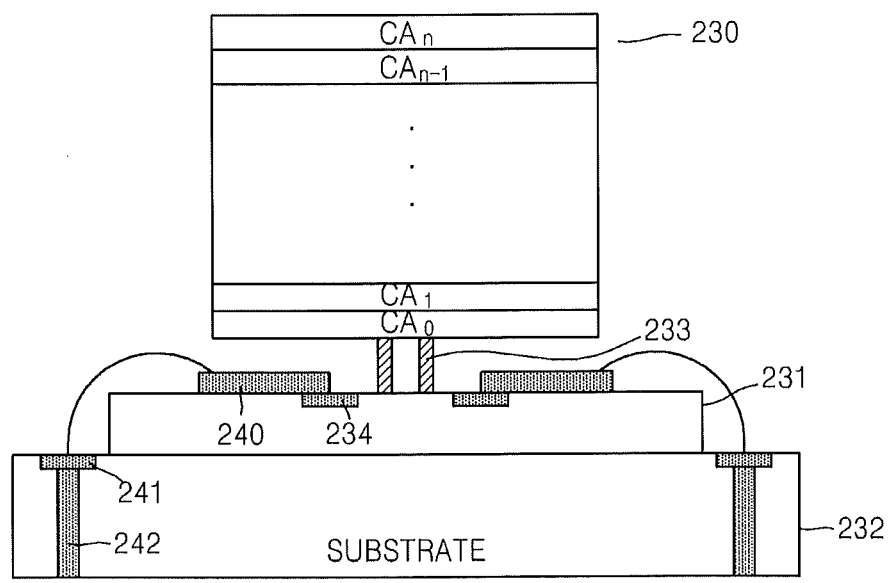
Figure 25:
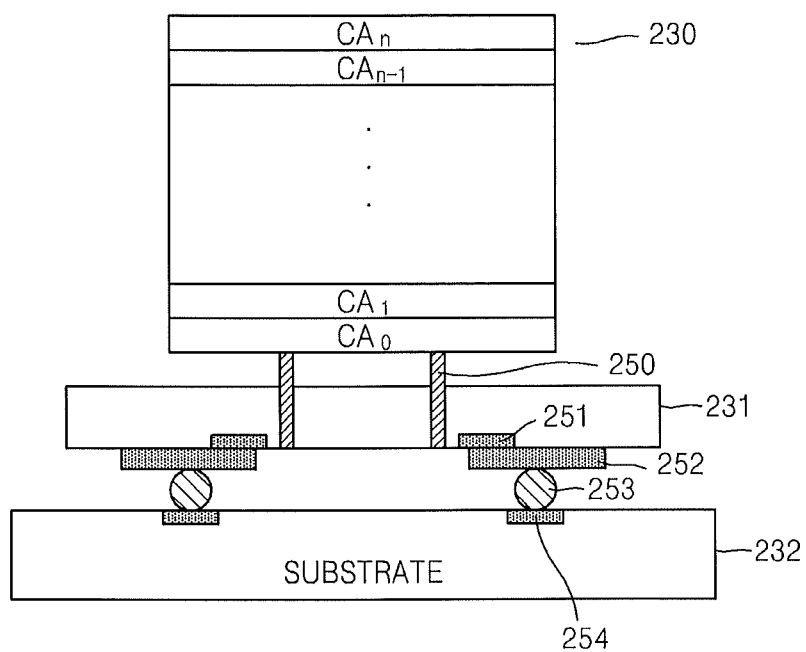

FIGS. 23 to 25 are cross sectional diagrams of application examples in which a semiconductor memory device having a 3D stacked structure is integrated in various ways according to some embodiments of the inventive concept.

Referring to FIG. 23, a semiconductor memory device having a 3D stacked structure includes a plurality of layers CA0 to CAn 230, which include memory cells and a master chip 231. Some embodiments provide that the plurality of layers 230 can operate in a slave operation relative to the master chip 231.

The master chip 231 may include an access line configuration for compensating for a time delay difference occurring between the layers CA0 to Can 230, which has been described in relation to the above-described embodiments, and a driver.

The master chip 231 has an input/output circuit for interfacing with the outside on a surface (hereinafter, a first surface) facing the layers CA0 to Can 230. The master chip 231 may further include the same structure as each of the layers CA0 to Can 230.

The layers CA0 to CAn 230 are stacked on the first surface of the master chip 231, and each of the layers CA0 to CAn 230 has a memory core.

The layers CA0 to CAn 230 are electrically connected to the master chip 231 through, for example, a first through electrode 233.

The layers CA0 to CAn 230 transmit and receive data and control signals through the first through electrode 233. A substrate 232 is electrically connected to the master chip 231.

Also, the layers CA0 to CAn 230 can be connected to the master chip 231 and/or the substrate 232 through the first through electrode 233, a first internal electrode 234, a second through electrode 235, and an external terminal 236.

The first internal electrode 234 is disposed on the first surface of the master chip 231. The second through electrode 235 electrically connects the first surface of the master chip 231 to a second surface (an opposite side of the first surface) of the master chip 231. The second through electrode 235 is extended to be electrically connected to the external terminal 236, and this extended part is disposed on the second surface of the master chip 231.

The master chip 231 is electrically connected to the substrate 232 through the external terminal 236 and a second internal electrode 237. Here, the first and second through electrodes 233 and 235 may be implemented by using a TSV. Some embodiments provide that the first and second through electrodes 233 and 235 may be replaced by a micro bump and/or wiring.

In FIG. 24, detailed descriptions of the same configuration as shown in FIG. 23 will be omitted here. Unlike FIG. 23, in FIG. 24, the master chip 231 does not have a through electrode. A second internal electrode 240 extended from the first internal electrode 234 is electrically connected to a third internal electrode 241 that is disposed on the substrate 232 through a bonding wire.

In addition, both surfaces of the substrate 232 are electrically connected through a second through electrode 242. Further, in FIG. 24, the layers CA0 to CAn 230 can be electrically connected to the master chip 231 and/or the substrate 232 through the first internal electrode 234, the second internal electrode 240, and the bonding wire.

Referring to FIG. 25, the memory cell 230 has a structure in which the first through electrode 233 of the structure of FIG. 23 is extended to penetrate the master chip 231.

In addition, an input/output circuit and a memory core of the master chip 231 faces the substrate 232 unlike in FIG. 24.

Since a first through electrode 250 electrically connecting the master chip 231 to the layers CA0 to Can 230 penetrates the master chip 231 to the second surface of the master chip 231, which faces the substrate 232, a semiconductor device having the 3D stacked structure shown in FIG. 25 does not require the second through electrode 235 unlike in FIG. 23, and the layers CA0 to CAn 230 can be electrically connected to the substrate 232 through the first through electrode 250, a first internal electrode 251, a second internal electrode 252, an external terminal 253, and a third internal electrode 254. Thus, a semiconductor device having the 3D stacked structure shown in FIG. 25 can reduce a TSV processing stage, thereby reducing manufacturing costs.

As described above, in a semiconductor device having a 3D stacked structure, a data access and input/output path difference between layers due to the structure and a timing delay difference due to the data access and input/output path difference can be compensated for without any additional separate interconnection.

While the inventive concept has been particularly shown and described with reference to exemplary embodiments thereof, it will be understood that various changes in form and details may be made therein without departing from the spirit and scope of the following claims.

What is claimed is:

1. A semiconductor device having a 3 dimensional (3D) stacked structure, the semiconductor device comprising:
a first semiconductor area with a stacked structure of a first layer having first data and a second layer having second data;
a first line that is operable to deliver an access signal that provides access to the first semiconductor area; and
a second line that is operable to output at least one of the first data and the second data from the first semiconductor area,
wherein access timings of accessing the first and second layers are controlled so that a first time delay from the delivery of the access signal to the first layer to the output of the first data is substantially identical to a second time delay from the delivery of the access signal to the second layer to the output of the second data.

2. The semiconductor device of claim 1, wherein the access timings to access the first and second layers through the first line are compensated to compensate for an output timing difference of the first and second data from the first and second layers through the second line.

3. The semiconductor device of claim 1, wherein access through the first line is first performed for a layer having a late output timing to compensate for an output timing difference between the first and second data due to a difference in physical position of the second line disposed in correspondence with the first and second layers.

4. The semiconductor device of claim 1, further comprising a second semiconductor area that is stacked with the first and second layers, wherein the second semiconductor layer controls the first semiconductor area and interfaces with a device that is external to the semiconductor device.

5. The semiconductor device of claim 4, wherein access through the first line is first performed for the first layer having a late data output timing through the second line to the second semiconductor area.

6. The semiconductor device of claim 5, wherein the access signal is delivered in a first direction that is a direction from the second semiconductor area towards the first layer, and
wherein the access through the first line is performed in a second direction that is substantially opposite the first direction.

7. The semiconductor device of claim 6, further comprising a third line that is operable to receive the access signal and to deliver the access signal to the first line of each of the first and second layers,
wherein the third line comprises:
a first delivery line that is operable to deliver the access signal in the first direction; and
a second delivery line that is operable to sequentially deliver the access signal delivered in the first direction to the first line of each of the first and second layers in the second direction.

8. The semiconductor device of claim 7, wherein the third line is commonly connected to the first and second layers.

9. The semiconductor device of claim 6, further comprising a plurality of third lines that are operable to receive the access signal and to deliver the access signal to the first line of each of the first and second layers.

10. The semiconductor device of claim 9, wherein the plurality of third lines are alternately connected to the first and second layers in the second direction.

11. The semiconductor device of claim 4, further comprising a plurality of third lines that are operable to receive the access signal and to deliver the access signal to the first line,
wherein the plurality of third lines are separately disposed in correspondence with the first and second layers.

12. The semiconductor device of claim 1, further comprising N layers (N is an integer) stacked with the first and second layers,
wherein the first semiconductor area comprises a plurality of groups having different data output timings, each group comprising at least one layer having substantially the same data output timing.

13. The semiconductor device of claim 12, wherein access through the first line is first performed for a group having the latest data output timing.

* * * * *